United States Patent
Lee et al.

(10) Patent No.: US 10,910,448 B2
(45) Date of Patent: Feb. 2, 2021

(54) ORGANIC LIGHT-EMITTING DISPLAY DEVICE AND METHOD OF FABRICATING THE SAME

(71) Applicant: LG Display Co., Ltd., Seoul (KR)

(72) Inventors: Sang-Bin Lee, Paju-si (KR); Yun-Joo Cho, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/729,125

(22) Filed: Dec. 27, 2019

(65) Prior Publication Data
US 2020/0212134 A1 Jul. 2, 2020

(30) Foreign Application Priority Data
Dec. 28, 2018 (KR) .................. 10-2018-0172139

(51) Int. Cl.
*H01L 27/32* (2006.01)
*H01L 51/00* (2006.01)
*H01L 51/56* (2006.01)
*H01L 51/52* (2006.01)

(52) U.S. Cl.
CPC ...... *H01L 27/3223* (2013.01); *H01L 27/3211* (2013.01); *H01L 27/3246* (2013.01); *H01L 51/0003* (2013.01); *H01L 51/0028* (2013.01); *H01L 51/5259* (2013.01); *H01L 51/56* (2013.01); *H01L 2227/323* (2013.01)

(58) Field of Classification Search
CPC ............. H01L 27/3223; H01L 27/3211; H01L 27/3246; H01L 51/0003; H01L 51/0028; H01L 51/56; H01L 51/5259; H01L 2227/323; H01L 51/0002
See application file for complete search history.

(56) References Cited

U.S. PATENT DOCUMENTS

| | | | |
|---|---|---|---|
| 9,224,957 B1* | 12/2015 | Kang | H01L 27/3223 |
| 9,457,369 B2* | 10/2016 | Kim | H01L 27/3223 |
| 2009/0128020 A1* | 5/2009 | Takei | H01L 27/3246 313/504 |
| 2014/0042408 A1* | 2/2014 | Akagawa | H01L 51/56 257/40 |
| 2018/0374909 A1* | 12/2018 | Nishikiori | H01L 27/3246 |

* cited by examiner

*Primary Examiner* — Victor A Mandala
(74) *Attorney, Agent, or Firm* — Birch, Stewart, Kolasch & Birch, LLP

(57) ABSTRACT

An organic light-emitting display device and a method of fabricating the same are provided. The organic light emitting display device according to an example comprises a substrate including a pixel region including a plurality of red-subpixels, a plurality of green-subpixels, and a plurality of blue-subpixels, and a dummy pixel region including a plurality of dummy subpixels; a plurality of first bank layers disposed in the pixel region in a first direction and a second direction to define a plurality of subpixels; a plurality of second bank layers disposed on the first bank layers in the first direction in the pixel region to partition boundaries between a red-subpixel column, a green-subpixel column, and a blue-subpixel column; and an organic light-emitting element formed on each of the subpixels; and wherein at least one dummy subpixel forms a first dispensing region onto which an organic light-emitting material is dispensed.

24 Claims, 12 Drawing Sheets

ORGANIC LIGHT-EMITTING DISPLAY DEVICE AND METHOD OF FABRICATING THE SAME

CROSS-REFERENCE TO RELATED APPLICATIONS

This application claims the priority benefit of Korean Patent Application No. 10-2018-0172139, filed on Dec. 28, 2018, in the Korean Intellectual Property Office, which is incorporated herein by reference in its entirety into the present application.

BACKGROUND

1. Technical Field

The present disclosure relates to an organic light-emitting display device and a method of fabricating the same, and more particularly, to an organic light-emitting display device capable of being fabricated in high resolution and a method of fabricating the same.

2. Discussion of the Related Art

Recently, various flat panel display devices, which are configured in a thinned shape to significantly reduce weight and volume, have been developed. Among the flat panel display devices, organic light-emitting display devices are self-light emitting devices in which an organic light-emitting layer emits light, and have advantages of fast response speed, high luminous efficiency, high brightness, and a wide viewing angle.

The organic light-emitting layer is made of an organic light-emitting material and is mainly formed by a thermal deposition process, and when the organic light-emitting layer is formed by the thermal deposition process, the following problems occur.

In order to thermally deposit an organic light-emitting material, a metal mask is disposed on the entire surface of a substrate, and the organic light-emitting material is evaporated and deposited on the substrate in a state in which a region other than a display area is blocked to form an organic light-emitting layer. Accordingly, in order to form the organic light-emitting layer, many processes, such as disposing and aligning the metal mask, depositing the organic light-emitting material, and removing the metal mask, are needed, which causes a fabricating process to be complicated, a fabricating process to be delayed, and a fabricating cost to be increased.

Further, when the metal mask is misaligned, a defect occurs in the organic light-emitting layer, and thus, a separate alignment device for precisely aligning the metal mask is needed. Furthermore, in recent years, as a display device becomes larger, thermal deposition equipment also becomes larger, and such enlargement of the thermal deposition equipment not only increases the fabricating cost but also makes thermal deposition practically impossible in a case in which the display device is made to be extra-large over a certain size.

SUMMARY

An object of the invention is to provide an organic light-emitting display device and a method of fabricating the same capable of being rapidly processed and being manufactured in a large area by forming an organic light-emitting layer using a coating process.

Another object of the invention is to provide a high-resolution organic light-emitting display device and a method of fabricating the same by forming a separate dispensing region in a dummy pixel region without increasing cost and the number of processes.

In order to achieve these objects, the organic light emitting display device according to an example of the invention comprises a substrate including a pixel region including a plurality of red-subpixels, a plurality of green-subpixels, and a plurality of blue-subpixels, and a dummy pixel region including a plurality of dummy subpixels; a plurality of first bank layers disposed in the pixel region in a first direction and a second direction to define a plurality of subpixels; a plurality of second bank layers disposed on the first bank layers in the first direction in the pixel region to partition boundaries between a red-subpixel column, a green-subpixel column, and a blue-subpixel column; and an organic light-emitting element formed on each of the subpixels; wherein at least one dummy subpixel forms a first dispensing region onto which an organic light-emitting material is dispensed.

The first dispensing region can be formed to have a width larger than that of the red-, green-, or blue-subpixels.

The organic light-emitting display device can further comprise a first dummy bank layer formed between the dummy subpixels in the dummy pixel region.

The first bank layer and the first dummy bank layer can be made of a hydrophilic material, and the second bank layer can be made of a hydrophobic material. The second bank layer is formed to have a width less than a width of the first bank layer so that a portion of the first bank layer is exposed to have an organic light-emitting layer disposed thereon. The second bank layer can be formed to have a width that is the same as a width of the first bank layer.

The first dispensing region includes a red-dispensing region, a green-dispensing region, or a blue-dispensing region onto which a red-organic light-emitting material, a green-organic light-emitting material, or a blue-organic light-emitting material are dispensed, respectively.

The first bank layers can be disposed between the red-dispensing region, the green-dispensing region, and the blue-dispensing region, and between the red-, green-, and blue-subpixel columns of the pixel region.

The organic light-emitting display device can further comprise a second dummy bank layer formed between the dummy subpixels of different color and having hydrophobic. The second bank layers can be further disposed between the subpixel and the dummy subpixel of different colors.

The first dispensing region includes at least two dummy subpixels and a first dummy bank layer having hydrophilic is disposed between the at least two dummy subpixels in the first dispensing region.

The first dispensing region can include one dummy subpixel. The one dummy subpixel can be formed to have a width more than twice that of that of the red-, green-, or blue-subpixels.

The red-, green-, and blue-subpixels are formed to have different widths. In this case, the first dispensing region is formed to have the same width as the subpixel having the greatest width among the red-, green-, and blue-subpixels. Further, the subpixel, which has the greatest width among the red-, green-, and blue-subpixels of the pixel region, is a second dispensing region onto which the organic light-emitting material is dispensed, or the subpixel having the greatest width and the subpixel having the second greatest width among the red-, green-, and blue-subpixels of the pixel region are a second dispensing region and a third dispensing region, respectively, onto which the organic light-emitting materials are dispensed.

The method of fabricating an organic light-emitting display device comprises forming a plurality of first bank layers disposed in a pixel region of a substrate in a first direction and a second direction to define a plurality of red-subpixels, a plurality of green-subpixels, and a plurality of blue-subpixels, a plurality of second bank layers disposed on the first bank layers in the first direction to partition boundaries between a red-subpixel column, a green-subpixel column, and a blue-subpixel column, and a dummy pixel region including a plurality of dummy subpixels, at least one dummy subpixel forming a dispensing region onto which an organic light-emitting material is dispensed; forming a first electrode in the subpixel; coating the organic light-emitting material on each of the red-, green-, or blue-subpixel columns by dispensing the organic light-emitting material onto the dispensing region; and drying the organic light-emitting material to form an organic light-emitting layer.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Hereinafter, the present disclosure will be described in detail with reference to the accompanying drawings.

In order to form an organic light-emitting layer of an organic light-emitting display device, a coating method other than a thermal deposition method is used in the present disclosure. For example, the organic light-emitting layer can be formed by dispensing an organic light-emitting material in a solution form on a set region on a substrate and then allowing the dispensed organic light-emitting material to spread on the substrate. Accordingly, as compared to forming an organic light-emitting layer by a thermal deposition process, the coating method can simplify a fabricating process, can be performed quickly, and can also be usefully applied to a large-area display device.

In particular, when the organic light-emitting display device is fabricated in high resolution, since an area of a pixel is reduced, in the present disclosure, a separate dummy pixel is formed to secure a dispensing region onto which the organic light-emitting material can be accurately dispensed so that the organic light-emitting material is coated only on a corresponding pixel and does not penetrate into other pixels when a high-resolution organic light-emitting display device is fabricated.

Figure 1:
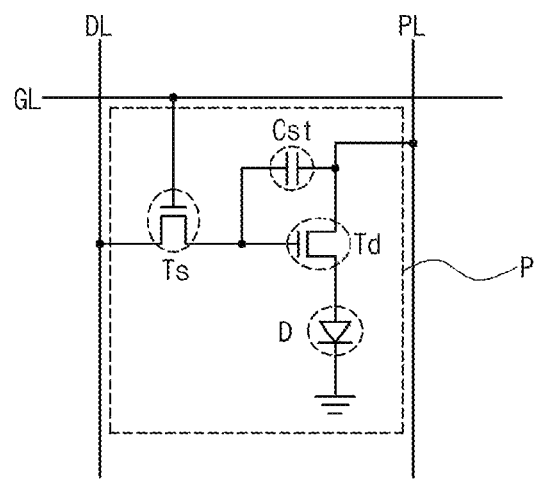
FIG. 1 is a circuit diagram conceptually illustrating one pixel of an organic light-emitting display device according to an example of the present disclosure.

FIG. 1 is a circuit diagram conceptually illustrating one pixel of an organic light-emitting display device according to the present disclosure. All the components of the organic light-emitting display device according to all embodiments of the present disclosure are operatively coupled and configured.

As illustrated in FIG. 1, the organic light-emitting display device according to the present disclosure includes a gate line GL, a data line DL, and a power line PL that cross each other to define a pixel P, and in the pixel P, a switching thin-film transistor Ts, a driving thin-film transistor Td, a storage capacitor Cst, and an organic light-emitting element D are disposed. The display device includes a plurality of the pixels P.

The switching thin-film transistor Ts is connected to the gate line GL and the data line DL, the driving thin-film transistor Td and the storage capacitor Cst are connected between the switching thin-film transistor Ts and the power line PL, and the organic light-emitting element D is connected to the driving thin-film transistor Td.

In the organic light-emitting display device having such a structure, when the switching thin-film transistor Ts is turned on in response to a gate signal applied through the gate line GL, a data signal applied through the data line DL is applied to a gate electrode of the driving thin-film transistor Td and one electrode of the storage capacitor Cst through the switching thin-film transistor Ts.

The driving thin-film transistor Td is turned on in response to a data signal applied to the gate electrode thereof, and as a result, a current proportional to the data signal flows from the power line PL to the organic light-emitting element D through the driving thin-film transistor Td, and the organic light-emitting element D emits light with a luminance proportional to the current flowing through the driving thin-film transistor Td.

Here, the storage capacitor Cst is charged with a voltage proportional to the data signal so that the voltage of the gate electrode of the driving thin-film transistor Td is maintained to be constant for one frame.

Figure 2:
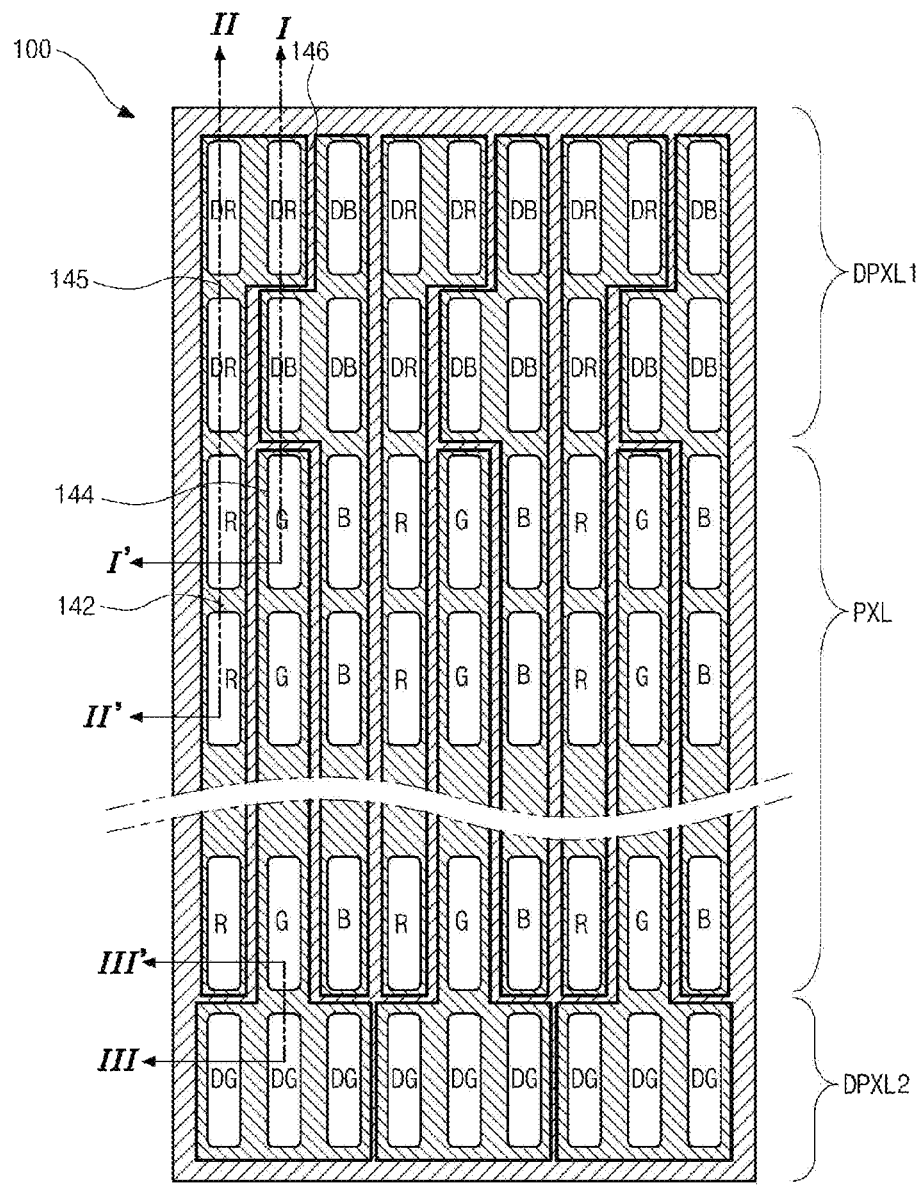
FIG. 2 is a plan view of an organic light-emitting display device according to a first embodiment of the present disclosure.

FIG. 2 is a plan view schematically illustrating a structure of an organic light-emitting display device according to a first embodiment of the present disclosure.

As illustrated in FIG. 2, an organic light-emitting display device 100 according to the first embodiment of the present disclosure includes a pixel region PXL, and a first dummy pixel region DPXL1 and a second dummy pixel region DPXL2 that are disposed in an upper region and a lower region of the pixel region PXL, respectively.

The pixel region PXL is a region in which an organic light-emitting layer is disposed and emits light to implement an actual image and includes a plurality of subpixels disposed therein. Here, the subpixels can be red subpixels R, green subpixels G, and blue subpixels B. The subpixels R, G, and B are each formed in a rectangular shape, the subpixels R, G, or B of the same color are arranged in a long side direction (i.e., a longitudinal direction) of the organic light-emitting display device 100, and the subpixels R, G, and B of different colors are arranged in the order of R-G-B-R-G-B in a short side direction (i.e., a transverse direction) of the organic light-emitting display device 100. However, the subpixels R, G, and B of the pixel region PXL may not be arranged in this order but can be arranged in a different order.

First bank layers 142 and second bank layers 144 are disposed in the pixel region PXL.

The first bank layer 142 is formed at an outer periphery of each of the plurality of subpixels R, G, and B in the pixel region PXL so that each of the subpixels R, G, and B is partitioned from the other subpixels R, G, and B. For example, the first bank layer 142 defines one subpixel R, G, or B in which one organic light-emitting element of the organic light-emitting display device is provided.

The second bank layers 144 are formed in the longitudinal direction in the pixel region PXL and are disposed in boundaries between the red, green, and blue subpixels R, G, and B. Since the plurality of subpixels R, G, or B of the same color are disposed in the longitudinal direction in a strip shape to form one column of the subpixels R, G, or B, the second bank layers 144 are disposed in boundaries between R-, G-, and B-subpixel columns of different colors to partition the R-, G-, and B-subpixel columns of different colors. Here, the second bank layer 144 is formed on the first bank layer 142 to have a width less than that of the first bank layer 142.

Dummy subpixels DR, DG, and DB are disposed in the first dummy pixel region DPXL1 and the second dummy pixel region DPXL2. In this case, two subpixel rows are formed in the first dummy pixel region DPXL1 and one subpixel row is formed in the second dummy pixel region DPXL2, but one subpixel row can be formed in the first dummy pixel region DPXL1 and two subpixel rows can be formed in the second dummy pixel region DPXL2.

In addition, red dummy subpixels DR and blue dummy subpixels DB are disposed in the first dummy pixel region DPXL1, and green dummy subpixels DG are disposed in the second dummy pixel region DPXL2, but the blue dummy subpixels DB and the green dummy subpixels DG can be disposed in the first dummy pixel region DPXL1 and the red dummy subpixels DR can be disposed in the second dummy pixel region DPXL2, or the red dummy subpixels DR and the green dummy subpixels DG can be disposed in the first dummy pixel region DPXL1 and the blue dummy subpixels DB can be disposed in the second dummy pixel region DPXL2.

Among the two subpixel rows of the first dummy pixel region DPXL1, two red dummy subpixels DR and one blue dummy subpixel DB can be disposed in a first subpixel row, and one red dummy subpixel DR and two blue dummy subpixels DB can be disposed in a second subpixel row. In addition, one red dummy subpixel DR and two blue dummy subpixels DB can be disposed in the first subpixel row, and two red dummy subpixels DR and one blue dummy subpixel DB can be disposed in the second subpixel row.

First dummy bank layers 145 and second dummy bank layers 146 are formed in each of the dummy pixel regions DPXL1 and DPXL2.

The first dummy bank layer 145 is formed in an outer periphery of each of the plurality of dummy subpixels DR, DG, and DB of the dummy pixel regions DPXL1 and DPXL2 so that each of the dummy subpixels DR, DG, and DB is partitioned from the other dummy subpixels DR, DG, and DB. The second dummy bank layer 146 is formed in a boundary between the red dummy subpixel DR and the blue dummy subpixel DB in the first dummy pixel region DPXL1 and is formed only in the outer periphery of a row of the green dummy subpixel DG in the second dummy pixel region DPXL2.

As will be described in detail below, a dispensing region in which the organic light-emitting material is dispensed is formed at two dummy subpixels of each of the first and second subpixel rows of the first dummy pixel region DPXL1, that is, at two red dummy subpixels DR and two blue dummy subpixels DB. Here, the dispensing region is formed to have a greater area than that of at least two subpixels so that, even when an alignment error occurs in a dispensing nozzle, a dispensing failure can be minimized while the organic light-emitting material is dispensed. In addition, the organic light-emitting layer of the organic light-emitting display device having a high-resolution can be formed using a general dispensing device by securing the dispensing region of a desired area even in the high-resolution organic light-emitting display device in which the area of the subpixel is reduced.

The dispensing region consisting of two dummy subpixels DR or DB forms a flow path with the subpixel column of the pixel region PXL, which has a corresponding color, so that the organic light-emitting material of a specific color dispensed in the dispensing region is spread to each of the subpixels R or B of the corresponding color of the pixel region PXL and uniformly coated on the entire R-subpixel column or the entire B-subpixel column of the pixel region PXL.

The row of the green dummy subpixel DG having a specific color is formed over the entire second dummy pixel region DPXL2 and at least two green dummy subpixels DG become the dispensing region. Of course, the whole row of the green dummy subpixel DG can also be used as the dispensing region. Here, the organic light-emitting material of a specific color (green) dispensed into the at least green dummy subpixels DG, that is, the dispensing region, is spread to the subpixels G of the corresponding color in the pixel region PXL, and thus a uniform organic light-emitting layer is formed in the green subpixel columns of the entire pixel region PXL.

Figure 3A:
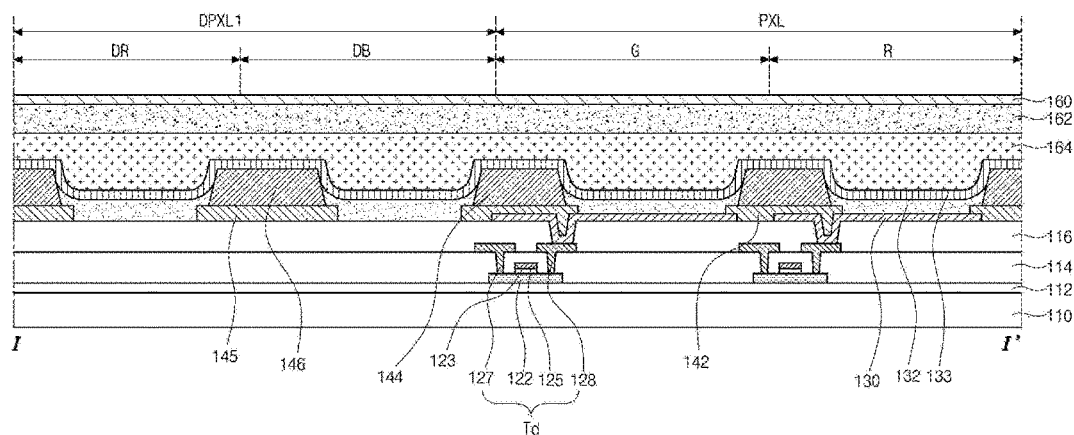
FIGS. 3A to 3C are cross-sectional views taken along lines I-I', II-II', and III-III' of FIG. 2, respectively.
Figure 3B:
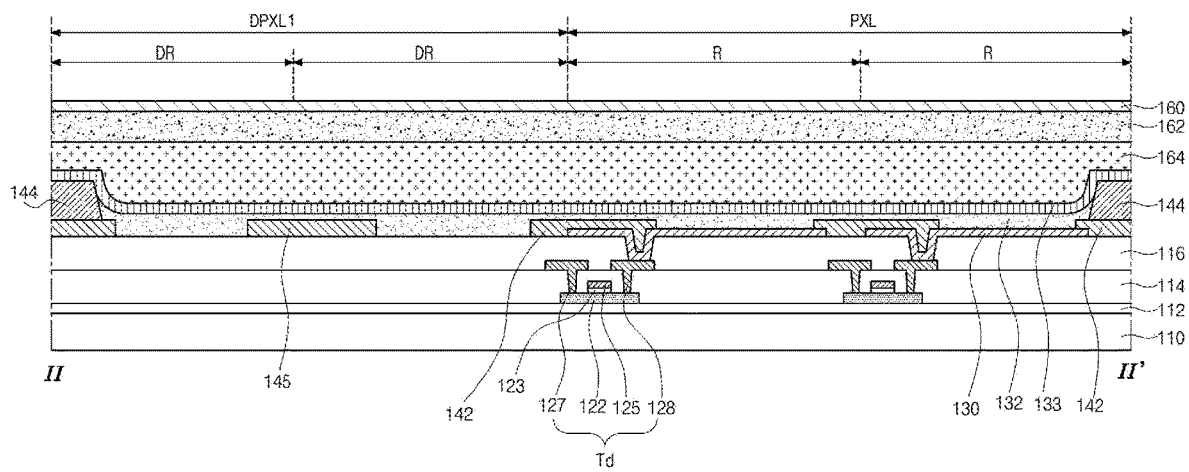
Figure 3C:
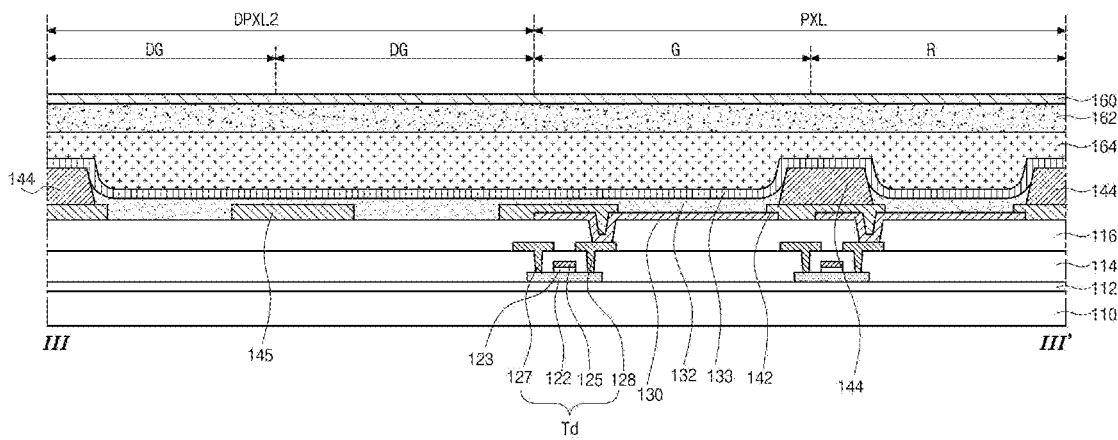

FIGS. 3A to 3C are cross-sectional views taken along lines I-I', II-II', and III-III' of FIG. 2, respectively. Here, FIG. 3A is a cross-sectional view illustrating the red dummy subpixel DR and the blue dummy subpixel DB of the first dummy pixel region DPXL1 and the green subpixel G and the red subpixel R of the pixel region PXL, and FIG. 3B is a cross-sectional view illustrating two adjacent red dummy subpixels DR of the first dummy pixel region DPXL1, which are disposed in the longitudinal direction, and two adjacent red subpixels R of the pixel region PXL, which are disposed in the longitudinal direction. In addition, FIG. 3C is a cross-sectional view illustrating the green dummy subpixel DG of the second dummy pixel region DPXL2 and the green subpixel G and the red subpixel R of the pixel region PXL.

As illustrated in FIG. 3A, a buffer layer 112 is formed on a first substrate 110 including the pixel region PXL and the dummy pixel regions DPXL1 and DPXL2, and a driving thin-film transistor Td is disposed on the buffer layer 112 in the pixel region PXL. The first substrate 110 can be made of a transparent material such as glass or can be made of a transparent and flexible plastic such as polyimide. In addition, the buffer layer 112 can be formed as a single layer or a plurality of layers made of an inorganic material such as SiOx or SiNx.

The driving thin-film transistor Td is formed in each of the plurality of pixels of the pixel region PXL, for example, in each of the green subpixels G and the red subpixels R, but is not formed in the dummy pixel regions DPXL1 and DPXL2, for example, in the red dummy subpixels DR and the blue dummy subpixels DB.

The driving thin-film transistor Td includes a semiconductor layer 122 formed in the pixel on the buffer layer 112, a gate insulating layer 123 formed on a partial region of the semiconductor layer 122, a gate electrode 125 formed on the gate insulating layer 123, an interlayer insulating layer 114 formed above the first substrate 110 to cover the gate electrode 125, and a source electrode 127 and a drain electrode 128 that are in contact with the semiconductor layer 122 through a first hole formed in the interlayer insulating layer 114.

Further, a switching thin-film transistor can be disposed on the first substrate 110, and the switching thin-film transistor can have the same structure as the driving thin-film transistor Td.

The semiconductor layer 122 can be formed of crystalline silicon or an oxide semiconductor such as indium gallium zinc oxide (IGZO) and include a channel layer in a central region thereof and a doped layer on both side surfaces thereof so that the source electrode 127 and the drain electrode 128 are in contact with the doped layer.

The gate electrode 125 can be made of a metal such as Cr, Mo, Ta, Cu, Ti, Al, or an Al alloy, and the gate insulating layer 123 and the interlayer insulating layer 114 can be formed as a single layer made of an inorganic insulating material such as SiOx or SiNx or an inorganic layer having a two-layer structure of SiOx and SiNx. In addition, the source electrode 127 and the drain electrode 128 can be made of Cr, Mo, Ta, Cu, Ti, Al, or an Al alloy.

In addition, in the drawings and the above description, the driving thin-film transistor Td is described as being formed in a specific structure, but the driving thin-film transistor Td of the present disclosure is not limited to the illustrated structure, and a driving thin-film transistor of any structure can be applied.

A protective layer 116 is formed over the entire first substrate 110 above which the driving thin-film transistor Td is formed. The protective layer 116 can be made of an organic material such as photo acryl but can also be formed as a plurality of layers of an inorganic layer and an organic layer. A second contact hole is formed in the protective layer 116.

A first electrode 130 is formed on the protective layer 116 in the pixel region PXL and is electrically connected to the drain electrode 128 of the driving thin-film transistor Td through the second contact hole. In addition, the first electrode 130 is formed as a single layer or a plurality of layers made of a metal such as Ca, Ba, Mg, Al, or Ag, or an alloy thereof and is connected to the drain electrode 128 of the driving thin-film transistor Td so that an image signal from the outside is applied to the first electrode 130.

The first bank layer 142 and the second bank layer 144 are formed on the protective layer 116 between the subpixels of different colors in the pixel region PXL, for example, in the boundary between the green subpixel G and the red subpixel R. Each of the first bank layer 142 and the second bank layer 144 is a kind of partition wall, and when the organic light-emitting material is dispensed in a solution state and spread out, the second bank layer 144 blocks the organic light-emitting materials of different colors from being mixed by partitioning each subpixel.

In addition, the first dummy bank layer 145 and the second dummy bank layer 146 disposed on the first dummy bank layer 145 are formed in the dummy subpixels of different colors disposed in the dummy pixel regions DPXL1 and DPXL2, for example, in the boundary between the red dummy subpixel DR and the blue dummy subpixel DB. Since the first dummy bank layer 145 and the second dummy bank layer 146 partition each dummy subpixel, the organic light-emitting material dispensed into the dummy subpixel of a specific color is not spread to the dummy subpixels of other colors.

Further, the first bank layer 142 and the second bank layer 144 disposed on the first bank layer 142 are disposed in the boundary between the dummy pixel regions DPXL1 and DPXL2 and the pixel region PXL, in particular, between the subpixel and the dummy subpixel of different colors, for example, between the blue dummy subpixel DB and the green subpixel G. Accordingly, the organic light-emitting material dispensed onto the dummy subpixel is blocked by the second bank layer 144 so as not to be spread to the subpixels, which have colors different from the color thereof, disposed in the same pixel column.

Meanwhile, the first bank layer 142 and the second bank layer 144 disposed on the first bank layers 142 are formed in the outermost portion of the organic light-emitting display device.

Although it is illustrated in the drawings that the first bank layer 142 is formed on the protective layer 116 and the second bank layer 144 is formed on the first bank layer 142, the first electrode 130 can be formed on the protective layer 116 and the first bank layer 142 can be formed on the first electrode 130. In addition, the first electrode 130 can extend toward side surfaces of the first bank layer 142 and the second bank layer 144.

The first bank layer 142 is made of a hydrophilic material and the second bank layer 144 is made of a hydrophobic material. Here, since a width of the first bank layer 142 is formed to be greater than a width of the second bank layer 144, a portion of the first bank layer 142 at both sides of the second bank layer 144 is exposed so that an organic light-emitting layer 132 is formed on the first electrode 130 and the portion of the first bank layer 142 that is exposed.

In addition, the width of the first bank layer 142 can be configured to be the same as the width of the second bank layer 144 so that the first bank layer 142 and the second bank layer 144 can be formed to be aligned with each other and the organic light-emitting layer 132 can be formed only on the first electrode 130.

The organic light-emitting layer 132 is formed on the first electrode 130 and the bank layers 142 and 144 of the pixel region PXL. As it will be described in detail below, the organic light-emitting layer 132 may not be formed by a thermal deposition method and can be formed by coating the organic light-emitting material in a solution state on the first electrode 130 followed by drying. The organic light-emitting layer 132 can be one of a red organic light-emitting layer that emits red light, a green organic light-emitting layer that emits green light, and a blue organic light-emitting layer that emits blue light, which are formed on the red, green, and blue subpixels R, G, and B, respectively.

The organic light-emitting layer 132 is illustrated in the drawings as being formed on one subpixel P, but in practice, the organic light-emitting layer 132 is formed over a plurality of identical subpixels P arranged in a strip shape from one side of the display device to the other side of the display device. Accordingly, the organic light-emitting layer 132 is not formed with a constant thickness in the plurality of subpixels P and has a variation in thickness between an outer periphery region and a central region of the display device. The reason for such a thickness variation is that the organic light-emitting layer 132 is formed by coating and drying rather than by a thermal deposition method.

For example, when the organic light-emitting material in a solution state is coated and dried, a solvent in the organic light-emitting material is removed by evaporation and only the organic light-emitting material remains, and in this case, the evaporation rate of the solvent in the outer periphery region of the display device is greater than that in the central region of the display device so that the organic light-emitting material in the outer periphery region of the display device is dried first. Accordingly, a portion of the undried organic light-emitting material in the central region is spread to the outer periphery region to generate a thickness variation between the outer periphery region and the central region of the display device.

The organic light-emitting layer 132 can include a light-emitting layer, an electron injection layer and a hole injection layer that inject electrons and holes into the light-emitting layer, respectively, and an electron transport layer and a hole transport layer that transport the injected electrons and holes to the light-emitting layer, respectively.

A second electrode 133 is formed on the organic light-emitting layer 132. The second electrode 133 can be made of a transparent conductive material such as indium tin oxide (ITO) or indium zinc oxide (IZO) or a metal having a thin thickness through which visible light is transmitted, but the present disclosure is not limited thereto.

The first dummy bank layer 145, and the second dummy bank layer 146 disposed on the first dummy bank layer 145 are formed on the protective layer 116 between the dummy subpixels DR, DG, and DB of the dummy pixel regions DPXL1 and DPXL2. The first dummy bank layer 145 is made of a hydrophilic material and the second dummy bank layer 146 is made of a hydrophobic material. Here, a width of the first dummy bank layer 145 is formed to be greater than a width of the second dummy bank layer 146 so that a portion of the first dummy bank layer 145 at both sides of the second dummy bank layer 146 is exposed. In addition, the width of the first dummy bank layer 145 can be configured to be the same as the width of the second dummy bank layer 146.

The first bank layer 142 of the pixel region PXL and the first dummy bank layer 145 of the dummy pixel regions DPXL1 and DXPL2 can be made of different materials but can be formed at the same time by the same process with the same hydrophilic material. The second bank layer 144 of the pixel region PXL and the second dummy bank layer 146 of the dummy pixel regions DPXL1 and DXPL2 can be made of different materials but can be formed at the same time by the same process with the same hydrophobic material.

An encapsulation layer 164 is formed in the pixel region PXL and the dummy pixel regions DPXL1 and DPXL2. The encapsulation layer 164 can be formed as a single layer of an inorganic layer, can be formed as two layers of an inorganic layer/an organic layer, or can be formed as three layers of an inorganic layer/an organic layer/an inorganic layer. The inorganic layer can be made of an inorganic material such as SiNx and SiOx, but the present disclosure is not limited thereto. In addition, the organic layer can be made of an organic material such as polyethylene terephthalate, polyethylene naphthalate, polycarbonate, polyimide, polyethylenesulfonate, polyoxymethylene, polyarylate, or a mixture thereof, but the present disclosure is not limited thereto.

An adhesive layer 162 is coated on the encapsulation layer 164 and a second substrate 160 is disposed on the adhesive layer 162, and thus the second substrate 160 is attached to the display device. Any material can be used as the adhesive layer as long as the material has high adhesion, heat resistance, and water resistance, but in the present disclosure, a thermosetting resin such as an epoxy-based compound, an acrylate-based compound, or an acrylic-based rubber can be used. In addition, a photocurable resin can be used as the adhesive layer, and in this case, the adhesive layer 162 is cured by irradiating light such as ultraviolet rays thereto.

The adhesive layer 162 may not only bond the first substrate 110 and the second substrate 160 but can serve as an encapsulant for preventing moisture from penetrating into the organic light-emitting display device as well. Accordingly, although the reference numeral "162" is expressed as the adhesive layer in the detailed description of the present disclosure, this is for convenience of description, and the adhesive layer can also be referred to as an encapsulant.

As the second substrate 160 serving as an encapsulation cap for encapsulating the organic light-emitting display device, a protective film such as a polystyrene (PS) film, a polyethylene (PE) film, a polyethylene naphthalate (PEN) film, or a polyimide (PI) film, or glass can be used.

A planarization layer can be formed in a space between the second electrode 133 and the adhesive layer 162. Here, the planarization layer can be formed of an organic layer or can be formed as a plurality of layers consisting of an inorganic layer and an organic layer. For example, SiOx or SiNx can be used as the inorganic layer, and photo acryl can be used as the organic layer, but the present disclosure is not limited thereto.

As illustrated in FIG. 3B, the driving thin-film transistor Td is not formed in the dummy subpixel of the first dummy pixel region DPXL1, for example, in the red dummy subpixel DR, and is formed in the subpixel of the pixel region PXL, for example, in the red subpixel R.

Here, in the boundary between the subpixels of the same color of the pixel region PXL, that is, between the red subpixel R and the red subpixel R, since only the first bank layer 142 is formed and the second bank layer 144 is not formed, the red organic light-emitting material coated on the red subpixel R is spread to the red subpixel R of the same pixel column. That is, the organic light-emitting material coated on the plurality of subpixels of the same color of the pixel region PXL disposed along the pixel column is spread over the entire pixel column.

In addition, in the boundary between subpixels of the same color of the first dummy pixel region DPXL1, for example, between the red dummy subpixel DR and the red dummy subpixel DR, since only the first dummy bank layer 145 is formed and the second dummy bank layer 146 is not formed, the red organic light-emitting material dispensed onto one red dummy subpixel DR is spread to the adjacent red dummy subpixel DR. For example, the organic light-emitting material dispensed onto the dummy subpixel of the specific color of the first dummy pixel region DPXL1 is spread to the adjacent dummy subpixels of the same color.

In addition, in the boundary between the first dummy pixel region DPXL1 and the pixel region PXL, in particular, between the subpixel and the dummy subpixel of the same color, for example, between the red dummy subpixel DR and the red subpixel R, since only the first bank layer 142 is formed and the second bank layer 144 is not formed, the red organic light-emitting material dispensed onto the red dummy subpixel DR is spread to the red subpixel R of the pixel region PXL. For example, the first bank layer 142 disposed in the boundary between the dummy subpixels and the subpixel of the same color disposed in one pixel column forms a spreading path through which the organic light-emitting material is spread so that the organic light-emitting material dispensed onto the dummy subpixel is spread to the plurality of subpixels of the same pixel column through the spreading path.

In addition, the encapsulation layer 164 formed as at least one layer is formed on the second electrode 133 of the first dummy pixel region DPXL1 and the pixel region PXL, and the second substrate 160 is attached to the encapsulation layer 164 using the adhesive layer 162.

As illustrated in FIG. 3C, the driving thin-film transistor Td is not formed in the dummy subpixel of the second dummy pixel region DPXL2, for example, in the green dummy subpixels DG, and is formed in the subpixels of the pixel region PXL, for example, in the green subpixel G and the red subpixel R.

Here, since the first bank layer 142 and the second bank layer 144 are formed in the boundary between the subpixels of different colors of the pixel region PXL, that is, between the green subpixel G and the red subpixel R, the green organic light-emitting material coated on the green subpixel G is not spread to the red subpixel R, and the red organic light-emitting material coated on the red subpixel R is also not spread to the green subpixel G.

In addition, in the boundary between subpixels of the same color of the second dummy pixel region DPXL2, for example, between the green dummy subpixel DG and the green dummy subpixel DG, since only the first dummy bank layer 145 is formed and the second dummy bank layer 146 is not formed, the green organic light-emitting material dispensed onto one green dummy subpixel DG is spread to the adjacent green dummy subpixel DG. For example, the organic light-emitting material dispensed onto the dummy subpixel of the specific color of the second dummy pixel region DPXL2 is spread to the adjacent dummy subpixels of the same color.

In addition, in the boundary between the second dummy pixel region DPXL2 and the pixel region PXL, in particular, between the subpixel and the dummy subpixel of the same color, for example, between the green dummy subpixel DG and the green subpixel G, since only the first bank layer 142 is formed and the second bank layer 144 is not formed, the green organic light-emitting material dispensed onto the green dummy subpixel DG is spread to the green subpixel G of the pixel region PXL. For example, the first bank layer 142 disposed in the boundary between the dummy subpixels and the subpixel of the same color disposed in one pixel column forms a spreading path through which the organic light-emitting material is spread so that the organic light-emitting material dispensed onto the dummy subpixel is spread to the plurality of subpixels of the same pixel column through the spreading path.

In addition, the encapsulation layer 164 formed as at least one layer is formed on the second electrode 133 of the second dummy pixel region DPXL2 and the pixel region PXL, and the second substrate 160 is attached to the encapsulation layer 164 using the adhesive layer 162.

In the organic light-emitting display device having the above-described structure, the first electrode 130, the organic light-emitting layer 132, and the second electrode 133 disposed in the pixel region PXL form an organic light-emitting element.

The first electrode 130 is a cathode of the organic light-emitting element and the second electrode 133 is an anode of the organic light-emitting element, and when a voltage is applied to the first electrode 130 and the second electrode 133, electrons are injected into the organic light-emitting layer 132 from the first electrode 130 and holes are injected into the organic light-emitting layer 132 from the second electrode 133 so that excitons are generated in the organic light-emitting layer 132, and as the excitons decay, light corresponding to an energy difference between lowest unoccupied molecular orbital (LUMO) and highest occupied molecular orbital (HOMO) of the light-emitting layer is generated and emitted to the outside (toward the second substrate 160).

In addition, the first electrode 130 of the organic light-emitting element is made of a transparent conductive material such as ITO or IZO or a metal having a thin thickness through which visible light is transmitted, and the second electrode 133 of the organic light-emitting element is formed as a single layer or a plurality of layers made of a metal such as Ca, Ba, Mg, Al, or Ag, or an alloy thereof so that light generated in the organic light-emitting layer 132 can be emitted to the outside (toward the first substrate 110).

In the organic light-emitting display device of the present disclosure, the above-described structure is not limited to the organic light-emitting element but can be applied to various organic light-emitting elements known in the art.

Meanwhile, as illustrated in FIGS. 3A to 3C, the driving thin-film transistor Td, the first electrode 130, the organic light-emitting layer 132, and the second electrode 133 are disposed in each of the subpixels R, G, and B of the pixel region PXL, and the organic light-emitting layer 132 emits light to display an image when a signal is applied from the outside.

On the other hand, the dummy pixel regions DPXL1 and DPXL2 are not regions in which images are implemented. As it will be described in detail below, the dummy pixel regions DPXL1 and DPXL2 are regions for expanding the area of the region in which the organic light-emitting material is dispensed and are for allowing the dispensed organic light-emitting material to spread to the corresponding subpixel of the pixel region PXL. Accordingly, in each of the dummy subpixels DR, DG, and DB of the dummy pixel regions DPXL1 and DPXL2, the driving thin-film transistor Td for applying a signal and the first electrode 130 are not formed, but the organic light-emitting layer 132 and the second electrode 133 are formed.

For example, in the dummy pixel regions DPXL1 and DXPL2, only the buffer layer 112, the interlayer insulating layer 114, the protective layer 116, the organic light-emitting layer 132, and the second electrode 133 are formed, and the driving thin-film transistor Td and the first electrode 130 are not formed. However, the second electrode 133 can be formed only in the pixel region PXL and may not be formed in the dummy pixel regions DPXL1 and DXPL2.

In addition, the driving thin-film transistor Td and the first electrode 130 can be formed in the dummy pixel regions DPXL1 and DPXL2. However, in this case, the driving signal is not applied to the thin-film transistors of the dummy pixel regions DPXL1 and DPXL2, and thus the organic light-emitting layer 132 does not emit light in the dummy pixel regions DPXL1 and DPXL2.

As described above, in the first embodiment of the present disclosure, the first and second dummy pixel regions DPXL1 and DPXL2 are provided in the outer periphery of the pixel region PXL, and at least two dummy subpixels of the dummy subpixels DR, DG, and DB, which have the same color and are adjacent to each other, are formed in the first and second dummy pixel regions DPXL1 and DPXL2.

At least two dummy subpixels of the dummy subpixels DR, DG, and DB, which have the same color and are adjacent to each other, are dispensing regions onto which the organic light-emitting materials in a solution state are dispensed when the organic light-emitting layer is formed and are provided to secure the dispensing region with a sufficient area to form the organic light-emitting layer of the high-resolution organic light-emitting display device. Hereinafter, a method of fabricating the organic light-emitting display device including the dispensing regions composed of the dummy subpixels DR, DG, and DB will be described in detail.

Figure 4:
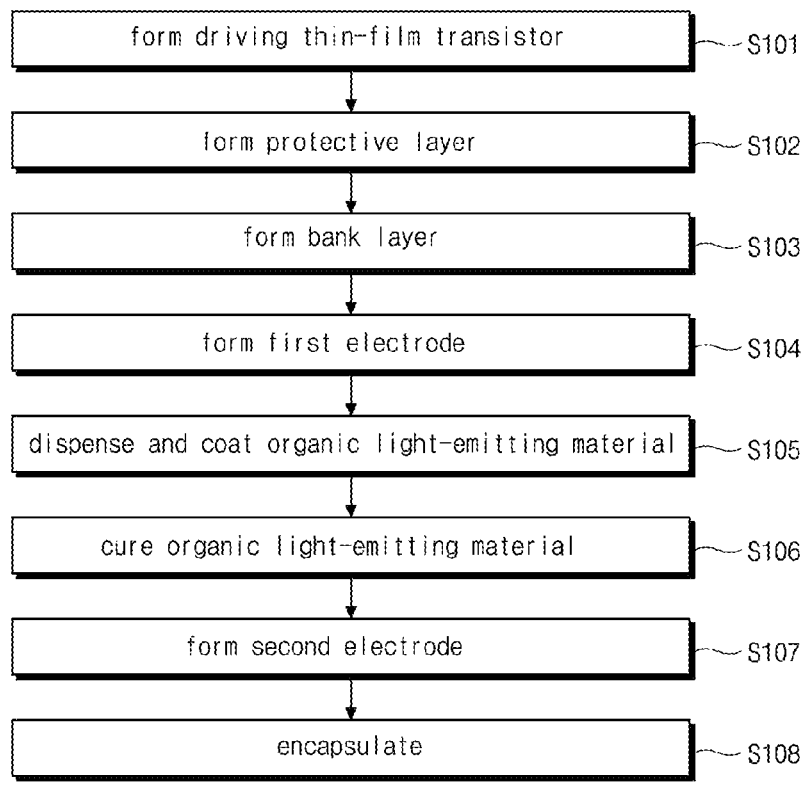
FIG. 4 is a flowchart illustrating a method of fabricating the organic light-emitting display device according to the first embodiment of the present disclosure.

FIG. 4 is a flowchart illustrating a method of fabricating the organic light-emitting display device according to the first embodiment of the present disclosure. The method of fabricating the organic light-emitting display device according to the first embodiment of the present disclosure will be described in detail with reference to the plan view and the cross-sectional views of FIGS. 2 and 3A to 3C and the flowchart of FIG. 4.

As illustrated in FIG. 4, first, the buffer layer 112 is formed on the first substrate 110, which includes the pixel region PXL and the dummy pixel regions DPXL1 and DPXL2, in the entire region or in the pixel region PXL, and then the driving thin-film transistor including the semiconductor layer 122, the gate insulating layer 123, the gate electrode 125, the interlayer insulating layer 114, the source electrode 127, and the drain electrode 128 is formed on the buffer layer 112 of the pixel region PXL (S101).

Subsequently, the protective layer 116 is formed over the entire first substrate 110 by stacking an organic material such as photo acryl (S102), and then the first bank layer 142 and the second bank layer 144 are formed on the protective layer 116 in the pixel region PXL (S103). Here, the first dummy bank layer 145 and the second dummy bank layer 146 are formed on the protective layer 116 in the dummy pixel regions DPXL1 and DPXL2.

Here, the first bank layers 142 are formed along the peripheries of all the subpixels R, G, and B of the pixel region PXL of the organic light-emitting display device to partition each of the subpixels from the other subpixels, and the second bank layer 144 partitions the subpixels R, G, or B of the same color from the other subpixels R, G, or B having different colors. The first dummy bank layers 145 are formed along the peripheries of all the dummy subpixels DR, DG, and DB of the dummy pixel regions DPXL1 and DPXL2 of the organic light-emitting display device to partition each of the dummy subpixels from the other dummy subpixels, and the second dummy bank layer 146 partitions the dummy subpixels DR, DG, or DB of the same color from the other dummy subpixels DR, DG, or DB having different colors. The first bank layer 142 or the first dummy bank layer 145 can be formed in the boundary between the subpixel R, G, or B of the pixel region PXL and the dummy subpixel DR, DG, or DB of the dummy pixel regions DPXL1 and DPXL2 having the same color, and the second bank layer 144 or the second dummy bank layer 146 can be formed in the boundary between the subpixel R, G, or B of the pixel region PXL and the dummy subpixel DR, DG, or DB of the dummy pixel regions DPXL1 and DPXL2 having different colors.

The first electrode 130 is formed in each of the subpixels R, G, and B defined by the first bank layer 142 of the pixel region PXL (S104), and then the organic light-emitting material is coated on the pixel region PXL and the dummy pixel regions DPXL1 and DPXL2 and cured to form the organic light-emitting layer 132 (S105 and S106). Here, the first electrode 130 is formed in units of the first bank layer 142, that is, in pixel units, so that the first electrodes 130 are separated from each other at the boundary between adjacent subpixels, but the organic light-emitting layer 132 is formed in units of the second bank layer 144, that is, in the unit of the subpixel column, so that the organic light-emitting layer 132 is continuously formed in the plurality of subpixels arranged in the longitudinal direction.

In addition, when the first electrode 130 is formed in the pixel region PXL, a metal layer can be simultaneously formed in the dummy pixel regions DPXL1 and DPXL2.

Thereafter, the second electrode 133 is formed on the organic light-emitting layer 132 in the pixel region PXL and encapsulated to complete the organic light-emitting display device (S107 and S108). When the second electrode 133 is formed in the pixel region PXL, a metal layer can be simultaneously formed in the dummy pixel regions DPXL1 and DPXL2.

As described above, in the organic light-emitting display device according to the present disclosure, the organic light-emitting layer 132 is formed by coating the organic light-emitting material on the regions partitioned by the first bank layer 142 and the second bank layer 144, followed by drying (or curing). In particular, in the present disclosure, the organic light-emitting layer is formed in the pixel region PXL by dispensing the organic light-emitting material onto the dummy pixel regions DPXL1 and DPXL2 and allowing the dispensed organic light-emitting material to spread in the pixel region PXL.

Figure 5:
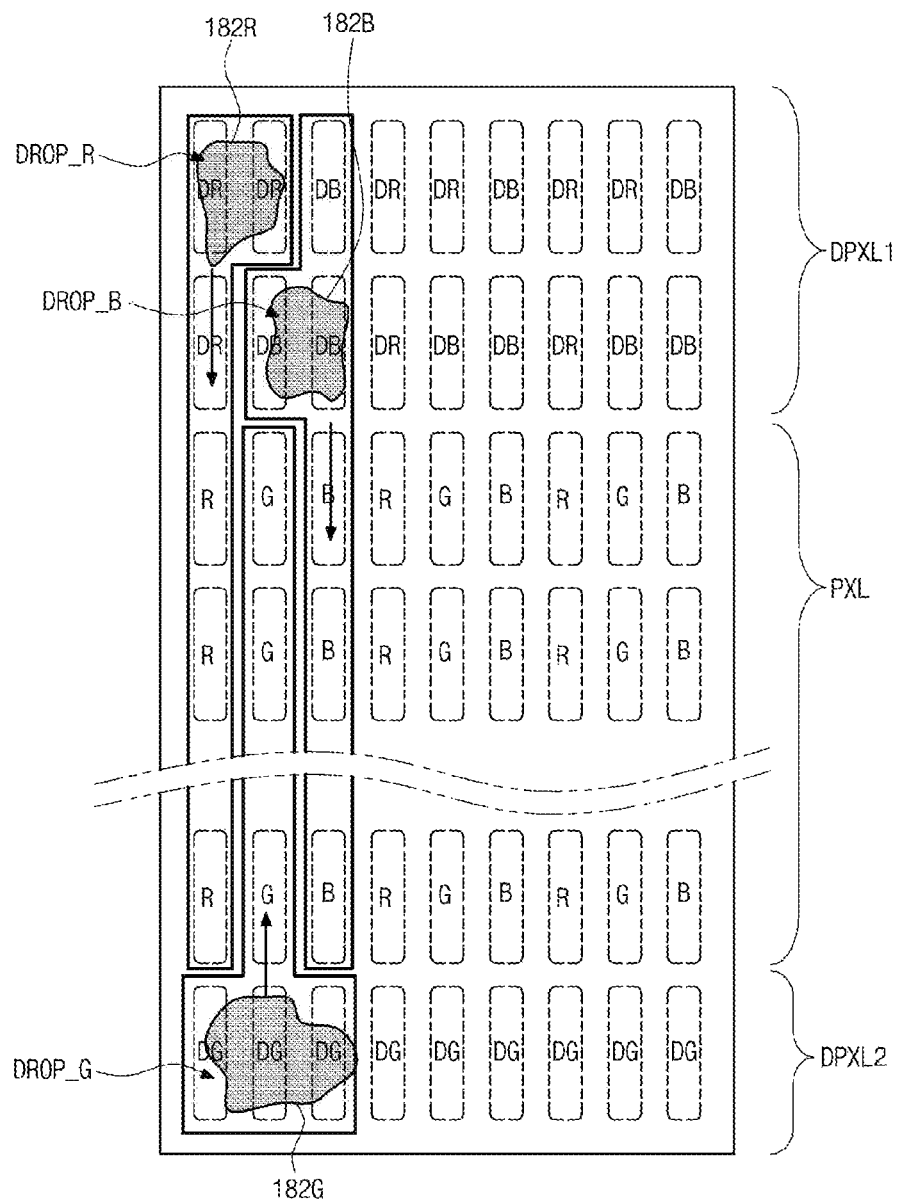
FIG. 5 is a view illustrating a case in which an organic light-emitting material dispensed in a dispensing region is spread to a pixel region in the organic light-emitting display device according to the first embodiment of the present disclosure.

FIG. 5 is a view conceptually illustrating a method of coating the organic light-emitting layer in the organic light-emitting display device according to the first embodiment of the present disclosure. As illustrated in FIG. 5, in a first dummy subpixel row of the first dummy pixel region DPXL1, the red dummy subpixels DR and the blue dummy subpixels DB are arranged in the order of DR-DR-DB-DR-DR, and in a second dummy subpixel row of the first dummy pixel region DPXL1, the red dummy subpixels DR and the blue dummy subpixels DB are arranged in the order of DR-DB-DB-DR-DB-DB. In addition, in the second dummy pixel region DPXL2, the green dummy subpixels DG are arranged.

For example, two adjacent red dummy subpixels DR are disposed in the first dummy subpixel row of the first dummy pixel region DPXL1, two adjacent blue dummy subpixels DB are disposed in the second dummy subpixel row of the first dummy pixel region DPXL1, and the green dummy subpixels DG are disposed in the second dummy pixel region DPXL2.

In the first dummy pixel region DPXL1, in the boundary between the dummy subpixels of the same color, that is, between two red dummy subpixels DR adjacent to each other and between two blue dummy subpixels DB adjacent to each other, only the hydrophilic first dummy bank layer 145 is formed and the second dummy bank layer 146 is not formed. In addition, the first dummy bank layer 145 and the second dummy bank layer 146 disposed on the first dummy bank layer 145 are formed in the outer periphery of the two adjacent red dummy subpixels DR and the outer periphery of the two adjacent blue dummy subpixels DB, that is, in the boundary between the red dummy subpixel DR and the blue dummy subpixel DB.

Since the boundary between the two adjacent red dummy subpixels DR and the boundary between the two adjacent blue dummy subpixels DB are partitioned by the hydrophilic first dummy bank layer 145, even when the red organic light-emitting material is dispensed in any region (including an upper portion of the first dummy bank layer 145) of the red dummy subpixel DR, the red organic light-emitting material is spread to the adjacent red dummy subpixel DR so that the red organic light-emitting material is dispensed onto all the two adjacent red dummy subpixels DR. In addition, even when the blue organic light-emitting material is dispensed in any region of the blue dummy subpixel DB (including the upper portion of the first dummy bank layer 145), the blue organic light-emitting material is spread to the adjacent blue dummy subpixel DB so that the blue organic light-emitting material is dispensed onto all the two adjacent blue dummy subpixels DB.

Accordingly, the two adjacent red dummy subpixels DR and the two adjacent blue dummy subpixels DB form an R-dispensing region DROP_R and a B-dispensing region DROP_B, respectively, onto which a red organic light-emitting material 182R and a blue organic light-emitting material 182B are dispensed, respectively.

In the boundary between the green dummy subpixels DG of the second dummy pixel region DPXL2, only the hydrophilic first dummy bank layer 145 is formed and the second dummy bank layer 146 is not formed. In addition, the first dummy bank layer 145 and the second dummy bank layer 146 are formed in the outer periphery of the second dummy pixel region DPXL2. The at least two green dummy subpixels DG in the second dummy pixel region DPXL2 forms a G-dispensing region DROP_G onto which a green organic light-emitting material 182G is dispensed.

In the boundary between the red subpixel column of the pixel region PXL, which is arranged in the longitudinal direction, and the R-dispensing region DROP_R, only the first bank layer 142 is disposed and the second bank layer 144 is not disposed (see FIG. 3A). In addition, the R-dispensing region DROP_R and the red subpixel column are partitioned from other dummy subpixels DB and other subpixels G and B by the second bank layer 144. Accordingly, the first bank layer 142 in the boundary between the red subpixel column of the pixel region PXL, which is arranged in the longitudinal direction, and the R-dispensing region DROP_R serves as a spreading path, through which the red organic light-emitting material is spread, due to hydrophilicity and the relatively low height thereof.

When the red organic light-emitting material 182R in a solution state is dispensed onto the R-dispensing region DROP_R of the first dummy pixel region DPXL1 using various dispensing devices such as syringes, slit coaters, drop coaters, and the like, the dispensed red organic light-emitting material 182R is spread to the corresponding red subpixel column of the pixel region PXL from the R-dispensing region DROP_R due to the first bank layer 142, and the red organic light-emitting material 182R is blocked by the second bank layer 144 from being spread to the subpixels G and B having colors different from the color thereof.

In addition, in the boundary between the blue subpixel column of the pixel region PXL, which is arranged in the longitudinal direction, and the B-dispensing region DROP_B, only the first bank layer 142 is disposed and the second bank layer 144 is not disposed (see FIG. 2). In addition, the B-dispensing region DROP_B and the blue subpixel column are partitioned from other dummy subpixels DR and other subpixels R and G by the second bank layer 144.

Accordingly, since the blue organic light-emitting material, which has fluidity and is dispensed in the B-dispensing region DROP_B, is spread only to the region partitioned by the second bank layer 144, the blue organic light-emitting material is spread only to the blue subpixels B of the pixel region PXL, which corresponds to the B-dispensing region DROP_B, and is not spread to the subpixels R and G having colors different from the color thereof.

In addition, in the boundary between the green subpixel column of the pixel region PXL, which is arranged in the longitudinal direction, and the G-dispensing region DROP_G, only the first bank layer 142 is disposed and the second bank layer 144 is not disposed (see FIG. 2). In addition, the green subpixel column is partitioned from other subpixels R and B by the second bank layer 144.

When the green organic light-emitting material 182G in a solution state is dispensed onto the G-dispensing region DROP_G using the dispensing device, the green organic light-emitting material 182G is spread only to the region partitioned by the second bank layer 144, and thus spread only to the green subpixel column of the pixel region PXL, which is corresponding to the G-dispensing region DROP_G.

As described above, the solvent included in the organic light-emitting materials 182R, 182G, and 182B can be removed by applying heat to the organic light-emitting materials 182R, 182G, and 182B coated on the subpixels R, G, and B of the pixel region PXL, respectively, to form red, green, and blue organic light-emitting layers, respectively.

As described above, in the present disclosure, since the organic light-emitting layer is formed by being coated using the dispensing method rather than the thermal deposition method, a deposition device such as a vacuum device or a metal mask is not required, thereby reducing manufacturing costs. In addition, since a process such as aligning the metal mask and the first substrate, or heating or depositing the organic light-emitting material is unnecessary, the manufacturing process can be simplified.

Furthermore, in the present disclosure, the organic light-emitting layer can be formed by dispensing the organic light-emitting materials onto only one sides of the series of subpixel columns, that is, the dispensing regions of the dummy pixel regions DPXL1 and DPXL2, and allowing the dispensed organic light-emitting materials to be spread to the corresponding subpixels R, G, and B of the pixel region PXL.

The most common method of coating the organic light-emitting material by dispensing is to dispense the organic light-emitting material of a color corresponding to each of the subpixels R, G, and B formed in the pixel region PXL, or to partition the subpixels R, G, and B of the subpixel column into a plurality of groups and dispense the organic light-emitting material into each group so that the organic light-emitting material is spread throughout the group.

However, in this case, since it is necessary to coat the organic light-emitting material on a large number of regions in the pixel region PXL, a relatively large number of dispensing devices and a large number of dispensing processes are required. Therefore, the dispensing device becomes complicated, and thus the device cost rises and a manufacturing process becomes complicated.

On the other hand, in the present disclosure, the organic light-emitting material can be dispensed onto only one region, that is, the dummy pixel regions DPXL1 and DPXL2, and coated on the entire subpixel columns of the corresponding pixel region PXL so that the dispensing device and the dispensing process can be simplified, thereby quickly dispensing the organic light-emitting material.

Figure 6A:
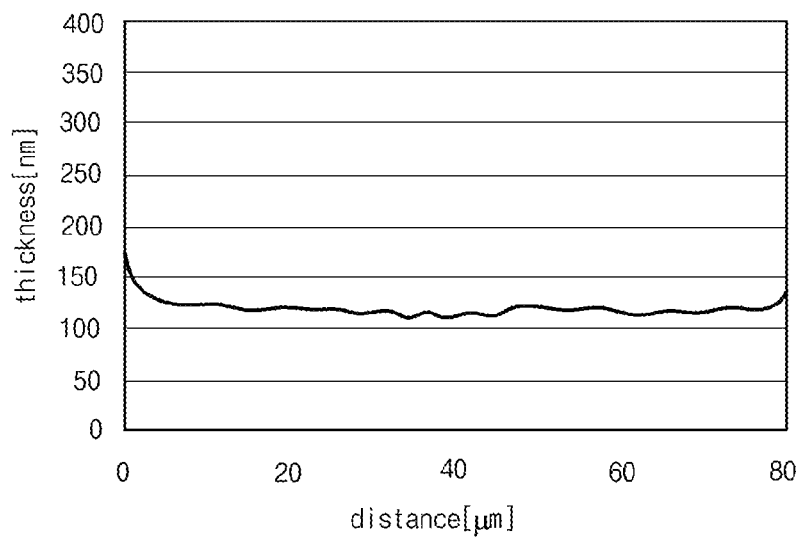
FIG. 6A is a graph illustrating a profile of an organic light-emitting layer formed in each of subpixels when the organic light-emitting material is dispensed onto a plurality of regions in a pixel region.
Figure 6B:
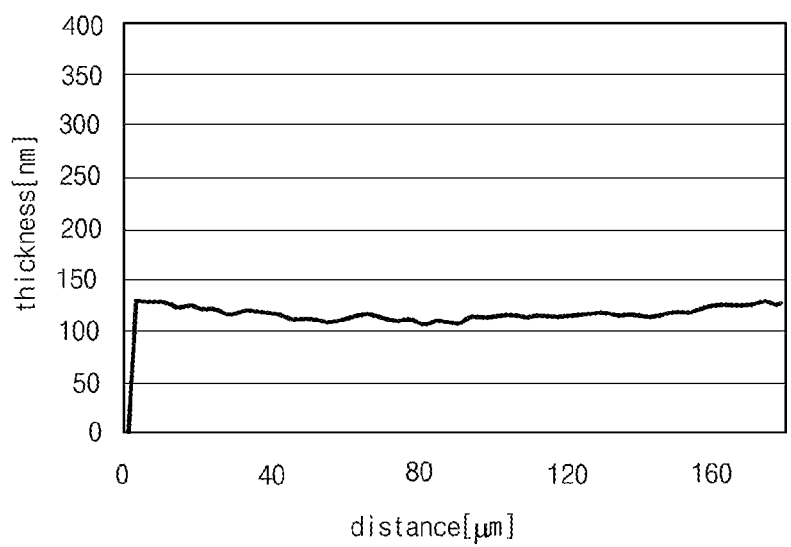
FIG. 6B is a graph illustrating a profile of the organic light-emitting layer formed in each of the subpixels when the organic light-emitting material is dispensed onto the dispensing region in a dummy pixel region.

FIG. 6A is a graph illustrating a profile of the organic light-emitting layer formed in each subpixel when the organic light-emitting material is dispensed onto the plurality of regions in the pixel region PXL, and FIG. 6B is a graph illustrating a profile of the organic light-emitting layer formed in each subpixel when the organic light-emitting material is dispensed onto the dummy pixel regions DPXL1 and DPXL2.

As illustrated in FIG. 6A, when the organic light-emitting material is dispensed onto the plurality of regions of the pixel region PXL, the organic light-emitting layer is formed uniformly over the entire subpixel region with a thickness of about 110 nm. In addition, as illustrated in FIG. 6B, even when the organic light-emitting material is dispensed onto the dummy pixel regions DPXL1 and DPXL2, the organic light-emitting layer is formed uniformly over the entire subpixel region with a thickness of about 110 nm.

As described above, even when the organic light-emitting material is dispensed in the dummy pixel regions DPXL1 and DPXL2 to form the organic light-emitting layer in the pixel region PXL, the organic light-emitting layer having a uniform thickness can be formed in the subpixels as in the case of forming the organic light-emitting layer by dispensing the organic light-emitting material directly onto the pixel region PXL, Accordingly, due to the present disclosure, the organic light-emitting layer having an accurate thickness can be formed quickly by an inexpensive dispensing device.

Meanwhile, in the present disclosure, the organic light-emitting layer can be easily formed in a high-resolution organic light-emitting display device by forming two or more dummy subpixels, which are adjacent in the dummy pixel regions DPXL1 and DPXL2, with the hydrophilic first bank layer interposed therebetween as the dispensing region and dispensing the organic light-emitting material onto the dispensing region. This will be described in more detail with reference to the accompanying drawings.

Figure 7A:
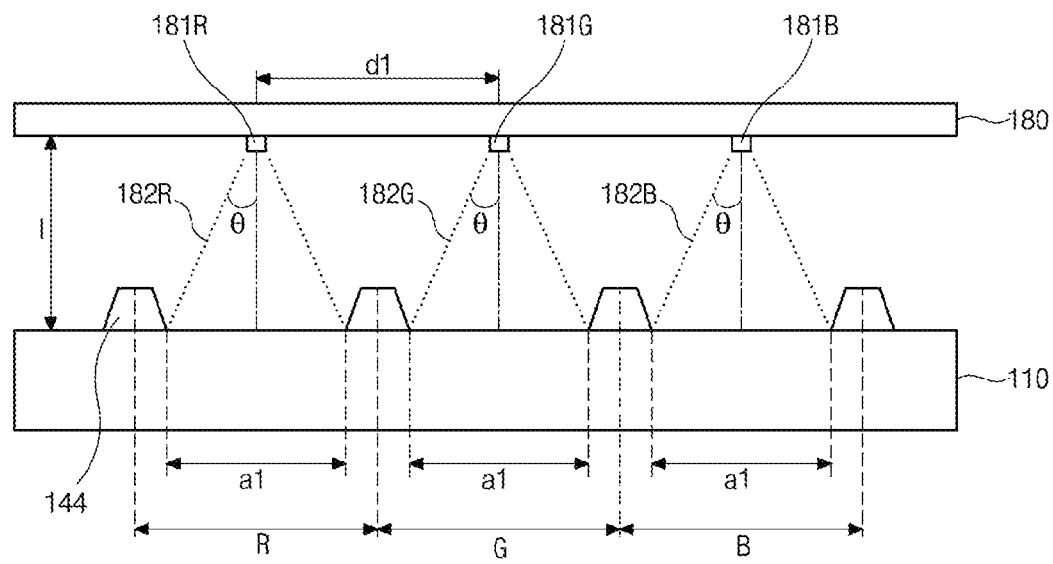
FIG. 7A illustrates a method of dispensing the organic light-emitting material directly onto each of the subpixels of different colors disposed in the pixel region.

FIG. 7A illustrates a method of dispensing the organic light-emitting material directly onto each of the subpixels R, G, and B of different colors disposed in the pixel region PXL. Here, the first bank layer 142 and the second bank layer 144 are formed between the subpixels R, G, and B of different colors, but for the convenience of description, only the second bank layer 144 partitioning the subpixels of different colors is illustrated in the drawing. In addition, other components such as the thin-film transistor and the like are also omitted.

As illustrated in FIG. 7A, in a general method of dispensing the organic light-emitting material, the red, green, and blue subpixels R, G, and B are formed on the first substrate 110, and at this point, the subpixels R, G, and B are partitioned by the first bank layer 142 and the second bank layer 144 on the first bank layer 142. In addition, the subpixels R, G, or B are arranged in a strip shape in the longitudinal direction, as illustrated in FIG. 2. In this case, the subpixels R, G, and B are formed to have the same width a1 (i.e., the same area).

A dispensing device such as a slit coater 180 is disposed above the first substrate 110. Spaces filled with the organic light-emitting materials are formed inside the slit coater 180, and the internal spaces can be connected to an external organic light-emitting material supply unit, and thus the organic light-emitting materials can be supplied to the internal spaces in real time.

The slit coater 180 includes a first nozzle 181R for discharging the red organic light-emitting material, a second nozzle 181G for discharging the green organic light-emitting material, and a third nozzle 181B for discharging the blue organic light-emitting material, which are disposed at a set interval d1. The red organic light-emitting material 182R, the green organic light-emitting material 182G, and the blue organic light-emitting material 182B are discharged from the first nozzle 181R, the second nozzle 181G, and the third nozzle 181B, respectively, and are dispensed onto the corresponding subpixels R, G, and B of the first substrate 110, respectively.

The slit coater 180 is formed over the entire first substrate 110 in the transverse direction (i.e., in a subpixel row direction), and the nozzles 181R, 181G, and 181B are formed in plural to correspond to the entire subpixels R, G, and B of the first substrate 110 arranged in the transverse direction and dispense the organic light-emitting materials onto all the subpixels of a first row of the pixel region PXL.

In addition, the slit coater 180 can move a predetermined distance in the longitudinal direction of the first substrate 110 after dispensing the organic light-emitting materials onto the first subpixel row and then discharge the red organic light-emitting material 182R, the green organic light-emitting material 182G, and the blue organic light-emitting material 182B onto the corresponding subpixels.

The organic light-emitting materials 182R, 182G, and 182B discharged from the slit coater 180 are discharged at a discharge angle θ set by each of the nozzles 181R, 181G, and 181B. Here, distances f between the nozzles 181R, 181G, and 181B and surfaces of the subpixels R, G, and B are all the same, and a width a1 of each of the subpixels R, G, and B is the same so that the discharge angle θ of each of the nozzles 181R, 181G, and 181B formed on the slit coater 180 is the same.

Figure 7B:
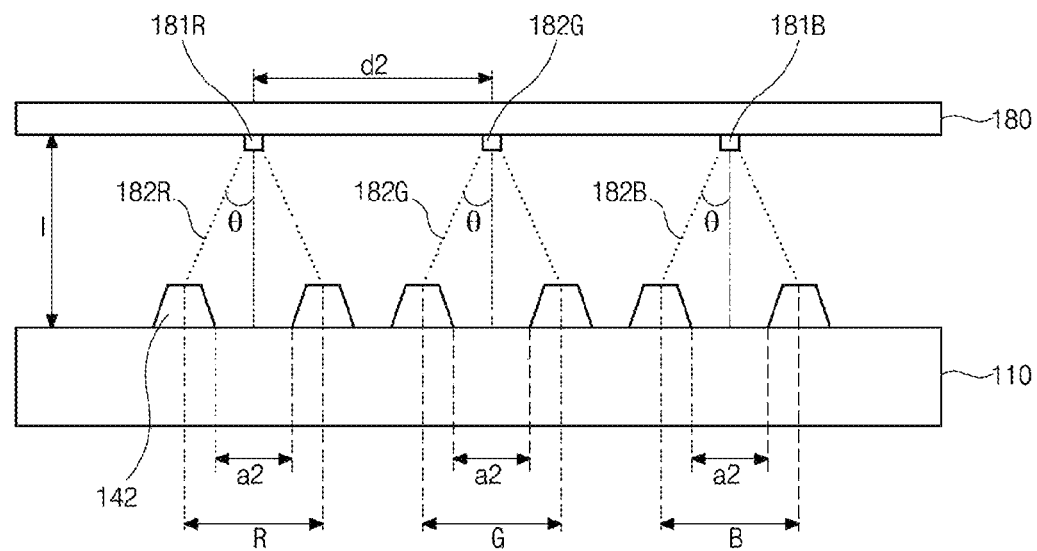
FIG. 7B is a view illustrating a dispensing method when a slit coater used in FIG. 7A is used in a high-resolution organic light-emitting display device.

FIG. 7B is a view illustrating a dispensing method when the slit coater 180 used in FIG. 7A is used in a high-resolution organic light-emitting display device.

As illustrated in FIG. 7B, since the number of subpixels R, G, and B disposed in the pixel region PXL in the same area increases as the resolution increases, the area of the subpixels R, G, and B decreases, and thus a width a2 of each of the subpixels R, G, and B is also reduced (a2<a1).

Accordingly, when the organic light-emitting materials 182R, 182G, and 182B are coated using the same slit coater 180 used in FIG. 7A, that is, when an interval between the nozzles 181R, 181G, and 181B is "d2" (d2<d1), the discharge angle of each of the nozzles 181R, 181G, and 181B is "θ", and the distance between the slit coater 180 and the first substrate 110 is "l", the organic light-emitting materials 182R, 182G, and 182B discharged through the nozzles 181R, 181G, and 181B are not only dispensed onto the subpixels R, G, and B, but also dispensed onto the second bank layers 144 between the subpixels R, G, and B.

The organic light-emitting material 182R, 182G, or 182B dispensed onto the second bank layer 144 does not flow only into the subpixel R, G, or B of the same color but can also flow into the adjacent subpixel R, G, or B having a color different from the color thereof, and in this case, an organic light-emitting layer in which the organic light-emitting materials of different colors are mixed can be formed, and thus the desired color may not be implemented in the corresponding subpixel, which causes the deterioration of image quality of the organic light-emitting display device.

Therefore, the discharge angles of the nozzles 181R, 181G, and 181B of the slit coater 180 should be reduced by a level corresponding to the narrowed subpixels R, G, and B to fabricate the high-resolution organic light-emitting display device, and accordingly, the fabricating cost of the dispensing device is increased, thereby increasing the overall fabricating costs of the organic light-emitting display device. Furthermore, since there is a limitation in reducing the discharge angles of the nozzles 181R, 181G, and 181B, the above-described slit coater 180 may not be applied to an ultra-high-resolution organic light-emitting display device.

In addition, in the case of a high-resolution organic light-emitting display device, not only the width of each of the subpixels R, G, and B, but also a pitch of each of the subpixels R, G, and B is reduced. Accordingly, the interval between the nozzles 181R, 181G, and 181B of the slit coater 180 is also reduced from "d1" to "d2", and thus the slit coater 180, which has the reduced interval d2 between the nozzles 181R, 181G, and 181B, not only increases fabricating costs but also has a limitation in reducing the interval d2 between the nozzles 181R, 181G, and 181B.

As described above, when the organic light-emitting materials 182R, 182G, and 182B are dispensed onto the subpixels R, G, and B formed in the pixel region PXL, respectively, or when the organic light-emitting materials 182R, 182G, and 182B are dispensed onto the dummy subpixels, respectively, disposed in the dummy pixel regions DPXL1 and DPXL2, it is impossible to fabricate a high-resolution organic light-emitting display device due to the limitations of the dispensing device, and in the case of fabricating a new dispensing device for dispensing the organic light-emitting materials 182R, 182G, and 182B onto the high-resolution organic light-emitting display device, the overall fabricating costs of the organic light-emitting display device are increased due to the fabricating costs of the expensive dispensing device.

Referring to FIG. 5 again, in the present disclosure, the R-dispensing region DROP_R including two dummy subpixels DR and the B-dispensing region DROP_B including two dummy subpixels DB are formed in the first dummy pixel region DPXL1, and the red organic light-emitting material 182R and the blue organic light-emitting material 182B are dispensed onto the R-dispensing region DROP_R and the B-dispensing region DROP_B, respectively.

Since the R-dispensing region DROP_R and the B-dispensing region DROP_B are each composed of two dummy subpixels and the first bank layer 142 therebetween, a width of each of the R-dispensing region DROP_R and the B-dispensing region DROP_B is 2a1+c (where a1 is the width of the dummy subpixel and c is the width of the first bank layer).

Further, in the present disclosure, the G-dispensing region DROP_G including the at least two dummy subpixels DG is formed in the second dummy pixel region DPXL2, and the green organic light-emitting material 182G is dispensed onto the G-dispensing region DROP_G. Since the G-dispensing region DROP_G is composed of all of the dummy subpixels DG and the first bank layer 142 therebetween, a width of the G-dispensing region DROP_G can be equal to a width of the second dummy pixel region DPXL2.

As described above, in the present disclosure, since the width of each of the dispensing regions DROP_R, DROP_G, and DROP_B onto which the organic light-emitting materials 182R, 182G, and 182B are dispensed, respectively, is at least twice the width of the subpixel, even when the resolution of the organic light-emitting display device is doubled, the dispensing device that is generally used can be used. Accordingly, there is no need to fabricate a dispensing device for a high-resolution, and thus the fabricating costs of the organic light-emitting display device can be reduced, and the organic light-emitting display device can be fabricated quickly. In addition, when the organic light-emitting material is dispensed using a general dispensing device, the dispensing tolerance can be minimized due to the widened dispensing region.

Figure 8:
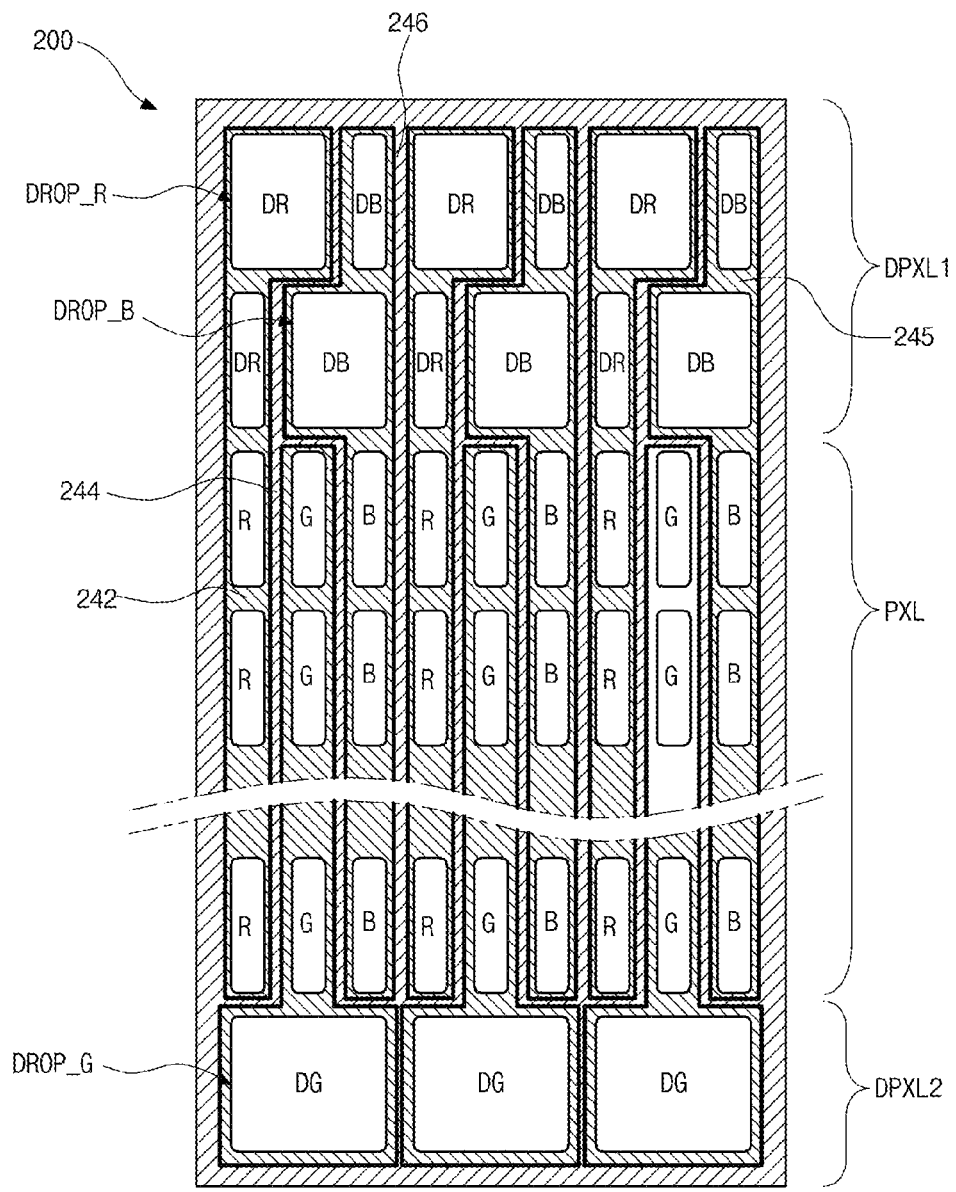
FIG. 8 is a plan view of an organic light-emitting display device according to a second embodiment of the present disclosure.

FIG. 8 is a plan view illustrating a structure of an organic light-emitting display device 200 according to a second embodiment of the present disclosure. In the organic light-emitting display device 200 of the present embodiment, since only the structure of the dummy subpixels of the first and second dummy pixel regions DPXL1 and DPXL2 is different from that of the first embodiment and other components are the same as those of the first embodiment, the description of the same component will be omitted or simplified and only the other components will be described in detail.

As illustrated in FIG. 8, in the present embodiment, a plurality of subpixels R, G, and B are disposed in a pixel region PXL in a strip shape in a longitudinal direction, and dummy subpixels DR, DG, and DB are disposed in a first dummy pixel region DPXL1 and a second dummy pixel region DPXL2. In this case, dispensing regions DROP_R, DROP_G, and DROP_B are formed in the first dummy pixel region DPXL1 and the second dummy pixel region DPXL2. The dispensing regions DROP_R, DROP_G, and DROP_B are configured with the dummy subpixels DR, DG, and DB, respectively, and formed to each have a greater area than each of the subpixels R, G, and B.

Substantially, the dispensing regions DROP_R, DROP_G, and DROP_B each have an area in which two subpixels R, G, or B are combined. In the first embodiment, the two dummy subpixels DR, DG, or DB disposed with the first dummy bank layer therebetween form one dispensing region DROP_R, DROP_G, or DROP_B, but in the present embodiment, the dummy subpixels DR, DG, and DB each having an area more than twice that of the first embodiment form the dispensing regions DROP_R, DROP_G, and DROP_B, respectively, without having a first dummy bank layer 245.

The dispensing region DROP_R, DROP_G, or DROP_B is disposed with a first bank layer 242 having hydrophilicity interposed between a corresponding column of the subpixels R, G, or B of the pixel region PXL, and is partitioned from the dummy subpixels DR, DG, and DB and the subpixels R, G, and B, which have colors different from the color thereof, by a second bank layer 244 having hydrophobicity so that an organic light-emitting material dispensed in each of the dispensing regions DROP_R, DROP_G, and DROP_B is spread to the corresponding column of the subpixels R, G, or B of the pixel region PXL, thereby forming organic light-emitting layers in the pixel region PXL.

As described above, in the present embodiment, since the organic light-emitting materials are dispensed onto the dispensing regions DROP_R, DROP_G, and DROP_B having a relatively wide region, a separate dispensing device is not required even when fabricating a high-resolution organic light-emitting display device so that the fabricating costs of the organic light-emitting display device can be reduced, and the organic light-emitting display device can be fabricated quickly. In addition, when the organic light-emitting material is dispensed using a general dispensing device, the dispensing tolerance can be minimized due to the widened dispensing region.

Figure 9:
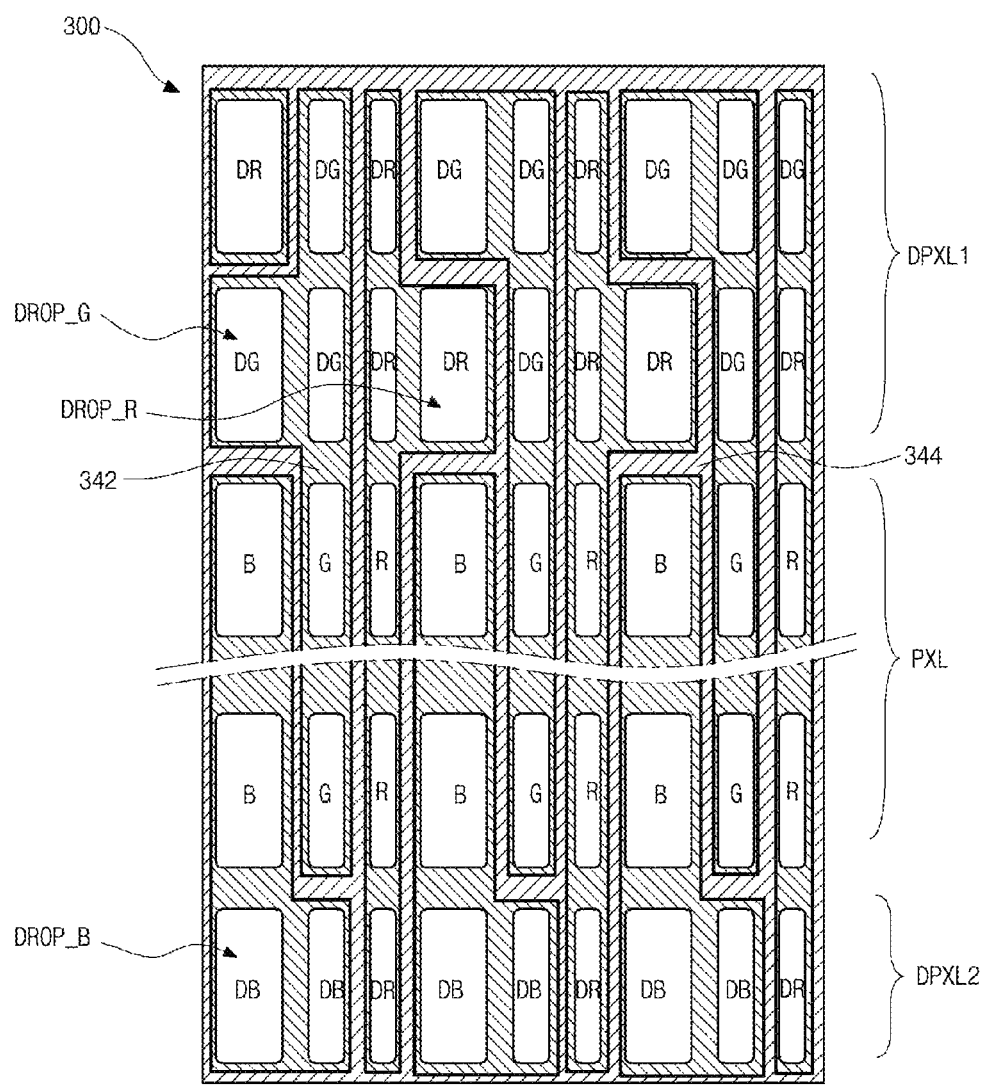
FIG. 9 is a plan view of an organic light-emitting display device according to a third embodiment of the present disclosure.

FIG. 9 is a plan view illustrating a structure of an organic light-emitting display device 300 according to a third embodiment of the present disclosure. Here, the organic light-emitting display device of the present embodiment has the same configuration as that of the first embodiment except for the shape of each of the subpixels R, G, and B and the dummy subpixels DR, DG, and DB and the shape of the bank layer, and thus the same configuration will be omitted or briefly described and only the other configurations will be described in detail.

As illustrated in FIG. 9, the organic light-emitting display device 300 of the present embodiment includes a pixel region PXL and first and second dummy pixel regions DPXL1 and DPXL2. A plurality of subpixels R, G, and B are disposed in the pixel region PXL, and red and green dummy subpixels DR and DG are disposed in a first dummy pixel region DPXL1. In addition, blue and red dummy subpixels DB and DR are disposed in a second dummy pixel region DPXL2.

Here, the subpixels R, G, and B disposed in the pixel region PXL have different areas. For example, red, green, and blue subpixels R, G, and B can be formed in an area ratio of 1:1.5:2, respectively, but the present disclosure is not limited thereto. The areas of the subpixels R, G, and B, strictly speaking, the light emitting areas of the subpixels R, G, and B, are set differently as described above because the luminance and the light efficiency, which are different for each color, are taken into consideration.

For example, although the luminance and light efficiency of light emitted from the subpixels R, G, and B should be uniform to emit light similar to natural light, since the organic light-emitting elements have different luminance and light efficiency for each color, when light-emitting regions of the subpixels R, G, and B are formed with the same size, the image quality of the organic light-emitting display device is deteriorated.

In general, the luminance and the light efficiency are deteriorated in the order of a red organic light-emitting element, a green organic light-emitting element, and a blue organic light-emitting element. In order to prevent such deterioration in light quality due to the deterioration in luminance and light efficiency, in the present embodiment, the light-emitting area of the subpixel having a color with low luminance and light efficiency is relatively increased to cancel out the low luminance and light efficiency. For example, by making the area of the red subpixel R (light-emitting region), the area of the green subpixel G (light-emitting region), and the area of the blue subpixel B (light-emitting region) in a ratio of 1:1.5:2, the display device can have a uniform luminance and light efficiency as a whole, thereby emitting light as close to natural light as possible.

Each of the dummy subpixels DR, DG, and DB disposed in the first and second dummy pixel regions DPXL1 and DPXL2 is formed in the same shape as the subpixels R, G, or B disposed in the corresponding column of the pixel region PXL but can be the dummy subpixel having the same color as or the different color from the subpixel. In other words, organic light-emitting layers formed in the subpixels R, G, or B and the dummy subpixels DR, DG, or DB, which are disposed in the same column in the pixel region PXL and the first and second dummy pixel regions DPXL1 and DPXL2, respectively, can have the same color or different colors, but the widths thereof are the same.

For example, the blue subpixel B is disposed in a first column of the pixel region PXL, the red dummy subpixel DR and the green dummy subpixel DG are disposed in a first column of the first dummy pixel region DPXL1, and the blue dummy subpixel DB is disposed in a first column of the second dummy pixel region DPXL2. Here, the blue subpixels B, the red dummy subpixels DR, the green dummy subpixels DG, and the blue dummy subpixels DB of the first column are all formed to have the same width as the blue subpixel B.

In addition, the green subpixel G is disposed in a second column of the pixel region PXL, the green dummy subpixel DG is disposed in a second column of the first dummy pixel region DPXL1, and the blue dummy subpixel DB is disposed in a second column of the second dummy pixel region DPXL2. Here, the green subpixels G, the green dummy subpixels DG, and the blue dummy subpixels DB of the second column are all formed to have the same width as the green subpixel G.

In addition, the red subpixel R is disposed in a third column of the pixel region PXL, the red dummy subpixel DR is disposed in a third column of the first dummy pixel region DPXL1, and the red dummy subpixel DR is disposed in a third column of the second dummy pixel region DPXL2. In this case, the red subpixels R and the red dummy subpixels DR of the third column are all formed to have the same width as the red subpixel R.

In other words, the green dummy subpixel DG and the red dummy subpixel DR each having the same width as the blue subpixel B are formed in the first dummy pixel region DPXL1. In addition, the blue dummy subpixel DB having the same width as the blue subpixel B is also formed in the second dummy pixel region DPXL2.

The green dummy subpixels DG, the red dummy subpixels DR, and the blue dummy subpixels DB each having the same width as the blue subpixel B form the dispensing regions DROP_R, DROP_G, and DROP_B, respectively, onto which organic light-emitting materials are dispensed. The dispensing region DROP_R, DROP_G, or DROP_B is disposed with a first bank layer 342, which has hydrophilicity and a relatively low height, interposed between the red, green, or blue subpixel column arranged in the longitudinal direction in the pixel region PXL, and is partitioned from the dummy subpixels, which are adjacent thereto and have colors different from the color thereof, and the subpixels, which have colors different from the color thereof, by a second bank layer 344 having hydrophobicity and a relatively high height. Accordingly, the organic light-emitting material dispensed onto each of the dispensing regions DROP_R, DROP_G, and DROP_B is spread to the corresponding column of the subpixels R, G, or B of the pixel region PXL so that the organic light-emitting layer having a uniform thickness as a whole can be formed.

Meanwhile, the dummy subpixels DR, DG, or DB can be disposed in each of the first and second dummy pixel regions DPXL1 and DPXL2 with the dispensing region DROP_R, DROP_G, or DROP_B and the first bank layer 342, which are adjacent thereto and have colors the same as the colors thereof, interposed therebetween and can also act as a part of the dispensing region.

As described above, in the organic light-emitting display device of the present embodiment, the subpixels having different areas are disposed in the pixel region PXL, and the red, green, or blue dummy subpixel DR, DG, or DB, which has the same area with the subpixel having the greatest width (for example, the blue subpixel B in FIG. 9), is disposed in each of the first and second dummy pixel regions DPXL1 and DPXL2 to form the red, green, or blue dispensing region DROP_R, DROP_G, or DROP_B. Here, since the width of the red, green, or blue dispensing region DROP_R, DROP_G, or DROP_B is about twice the width of the smallest subpixel, for example, the red subpixel R, the area of the region in which the organic light-emitting material can be dispensed is greater than that of a general organic light-emitting display device. Accordingly, when the high-resolution organic light-emitting display device is fabricated, it is not necessary to use a separate dispensing device for a high-resolution so that the fabricating costs of the organic light-emitting display device can be reduced, and the organic light-emitting display device can be fabricated quickly. In addition, when the organic light-emitting material is dispensed using a general dispensing device, the dispensing tolerance can be minimized due to the widened dispensing region.

Meanwhile, although the subpixels R, G, and B are illustrated in the drawing as being formed in an area ratio of 1:1.5:2, the present embodiment is not limited to such a specific area ratio but the subpixels R, G, and B can be formed in various area ratios. In addition, although it is illustrated in the drawing that the R- and G-dispensing regions DROP_R and DROP_G are formed in the first dummy pixel region DPXL1, and the B-dispensing region DROP_B is formed in the second dummy pixel region DPXL2, the dispensing regions DROP_R, DROP_G, and DROP_B of the present embodiment can be configured not only with this configuration but also with various other configurations.

Figure 10A:
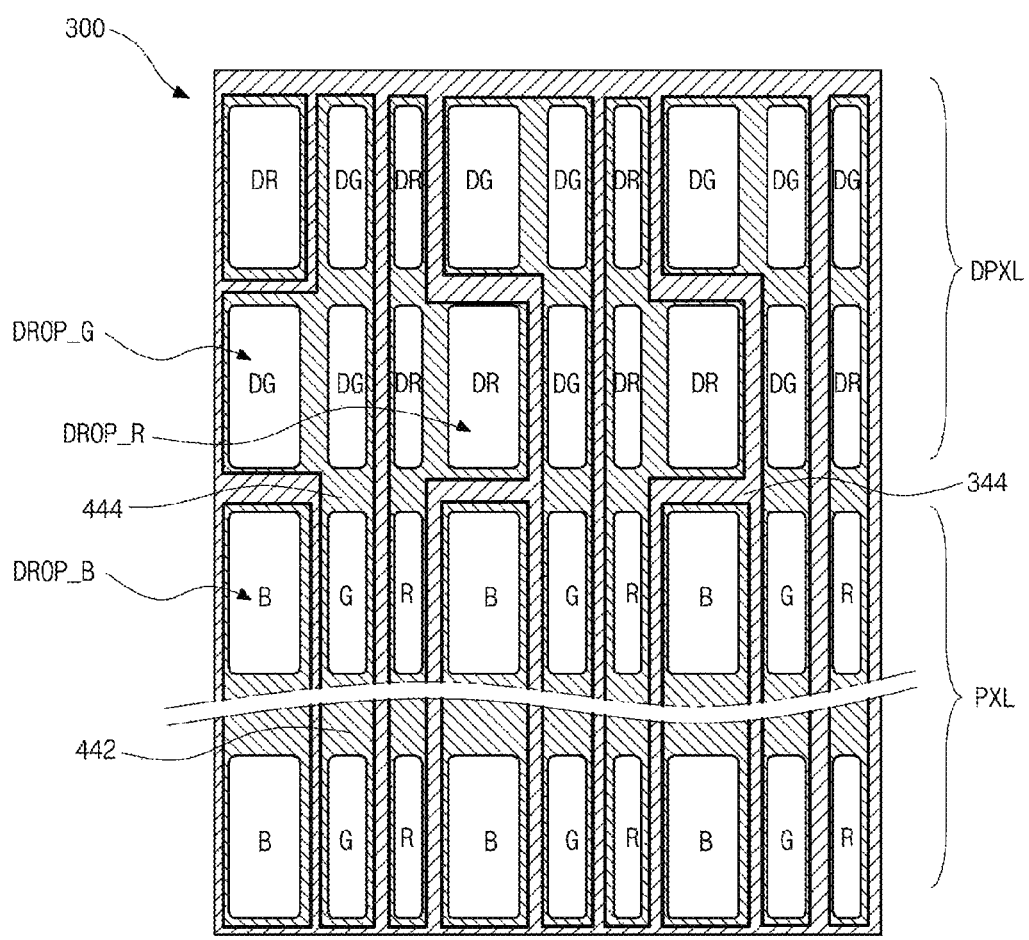
FIGS. 10A and 10B are plan views of an organic light-emitting display device according to a fourth embodiment of the present disclosure.
Figure 10B:
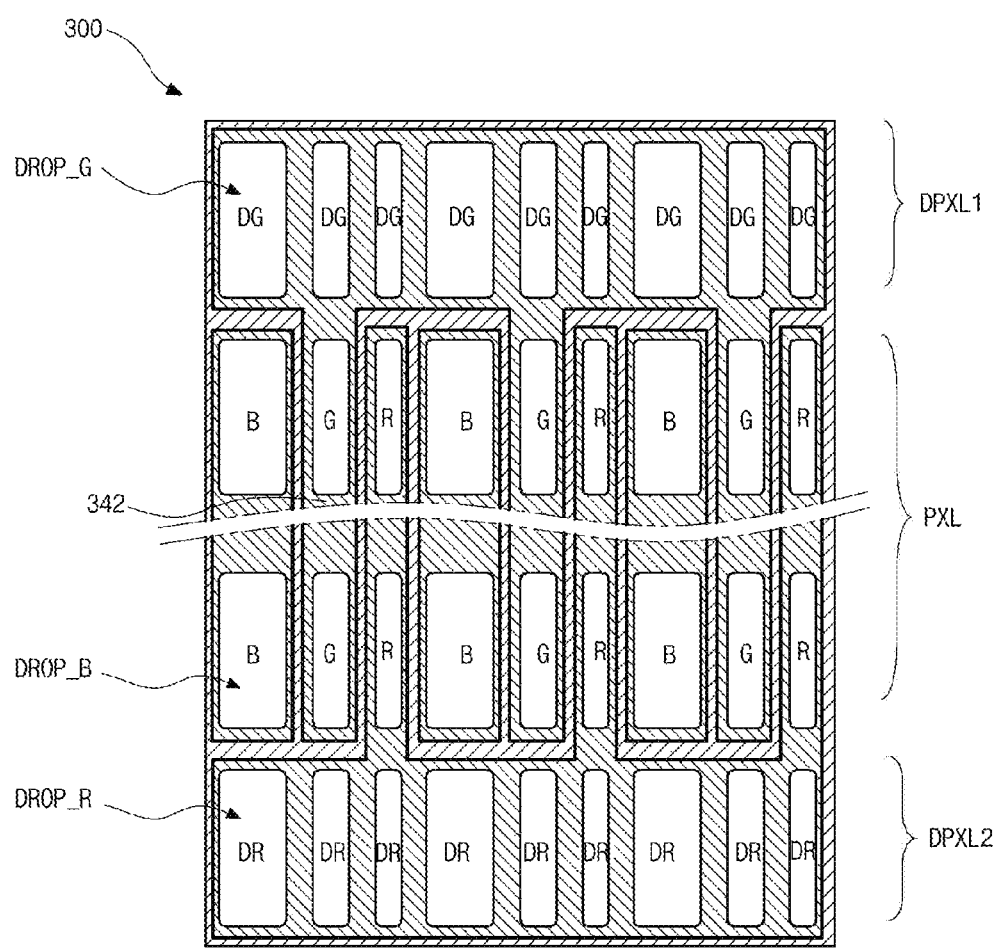

FIGS. 10A and 10B are plan views illustrating a structure of an organic light-emitting display device 400 according to a fourth embodiment of the present disclosure. Here, the organic light-emitting display device of the present embodiment has the same configuration as that of the third embodiment except for the shape of each of the subpixels R, G, and B and the dummy subpixels DR, DG, and DB and the shape of the bank layer, and thus the same configuration will be omitted or briefly described, and only the other configuration will be described in detail.

As illustrated in FIG. 10A, the organic light-emitting display device 400 of the present embodiment includes a pixel region PXL and a dummy pixel region DPXL, subpixels R, G, and B are disposed in the pixel region PXL with an area ratio of 1:1.5:2, and red and green dummy subpixels DR and DG are disposed in the dummy pixel region DPXL.

In the third embodiment, the second dummy pixel region is formed and the blue dummy subpixel DB onto which the blue organic light-emitting material is dispensed is formed in the second dummy pixel region, but in the present embodiment, the second dummy pixel region is not formed and the blue dummy subpixel DB onto which the blue organic light-emitting material is dispensed is also not formed.

In the present embodiment, in order to form an organic light-emitting layer in a blue subpixel column, a blue organic light-emitting material is dispensed directly onto the blue subpixel B in the pixel region PXL. Accordingly, in the present embodiment, an R-dispensing region DROP_R and a G-dispensing region DROP_G, which have the same width as that of the blue subpixel B, are formed in the dummy pixel region DPXL, and the blue subpixel B of the pixel region PXL is formed as a B-dispensing region DROP_B so that the organic light-emitting layer is formed by dispensing red, green, and blue organic light-emitting materials onto the dispensing regions DROP_R, DROP_G, and DROP_B, respectively.

As illustrated in FIG. 10B, in the present embodiment, a first dummy pixel region DPXL1 and a second dummy pixel region DPXL2 are formed on upper and lower portions of the pixel region PXL, respectively. The G-dispensing region DROP_G is formed in the first dummy pixel region DPXL1, and the R-dispensing region DROP_R is formed in the second dummy pixel region DPXL2 so that the green organic light-emitting material and the red organic light-emitting material can be dispensed onto the G-dispensing region DROP_G and R-dispensing region DROP_R, respectively. In addition, the blue organic light-emitting material can be dispensed directly onto the blue subpixel B of the pixel region PXL.

Accordingly, in the present embodiment, since the width of each of the red, green, and blue dispensing regions DROP_R, DROP_G, and DROP_B is the same as the width of the blue subpixel B, which is the subpixel having the greatest width, when a high-resolution organic light-emitting display device is fabricated, it is not necessary to use a separate dispensing device for a high-resolution. Accordingly, the fabricating costs of the organic light-emitting display device can be reduced, and the organic light-emitting display device can be fabricated quickly. In addition, when the organic light-emitting material is dispensed using a general dispensing device, the dispensing tolerance can be minimized due to the widened dispensing region.

Figure 11:
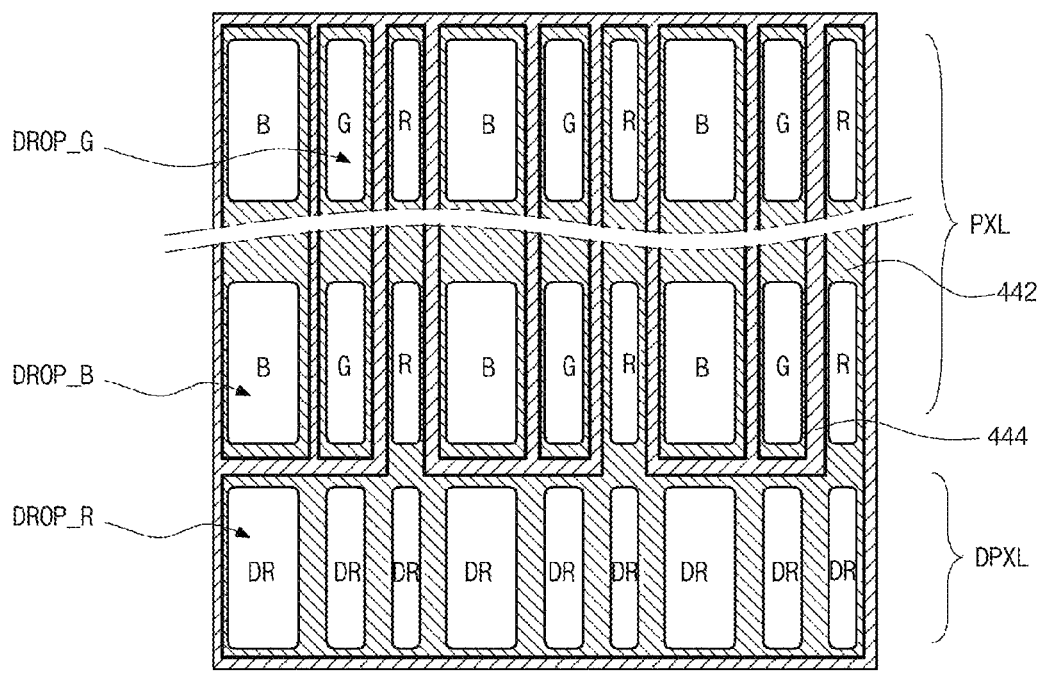
FIG. 11 is a plan view of an organic light-emitting display device according to a fifth embodiment of the present disclosure.

FIG. 11 is a plan view illustrating a structure of an organic light-emitting display device 500 according to a fifth embodiment of the present disclosure. Here, the organic light-emitting display device of the present embodiment has the same configuration as that of the fourth embodiment except for the shape of each of the subpixels R, G, and B and the dummy subpixels DR, DG, and DB and the shape of the bank layer, and thus the same configuration will be omitted or briefly described, and only the other configuration will be described in detail.

As illustrated in FIG. 11, the organic light-emitting display device 500 of the present embodiment includes a pixel region PXL and a dummy pixel region DPXL, subpixels R, G, and B are disposed in the pixel region PXL with an area ratio of 1:1.5:2, and a red dummy subpixels DR is disposed over the entire dummy pixel region DPXL.

In the present embodiment, an R-dispensing region DROP_R is formed in the entire dummy pixel region DPXL, and a G-dispensing region DROP_G and a B-dispensing region DROP_B are formed in the green subpixel G and the blue subpixel B of the pixel region PXL, respectively. For example, in the present embodiment, in order to form organic light-emitting layers in a green subpixel column and a blue subpixel column, a green organic light-emitting material and a blue organic light-emitting material are dispensed directly onto the green subpixel G and the blue subpixel B of the pixel region PXL, respectively.

In the third embodiment, the organic light-emitting material is coated on the blue subpixel column by forming the blue subpixel B having the greatest width as the B-dispensing region DROP_B and then dispensing the organic light-emitting material, and the organic light-emitting materials are coated on the green subpixel column and the red subpixel column by separately forming the R- and G-dispensing regions DROP_R and DROP_G in the dummy pixel regions and then dispensing the organic light-emitting materials, but in the present embodiment, the organic light-emitting material is coated by forming not only the blue subpixel B having the greatest width as B-dispensing regions DROP_B but also the green subpixel G having a medium-size width as G-dispensing regions DROP_G. Accordingly, in the dispensing device applied to the present embodiment, although the discharge angle of a nozzle should be reduced and the interval between the nozzles should be reduced as compared with the dispensing device applied to the third embodiment, since an R-dispensing region DROP_R for the red subpixel R having the smallest width can be formed to have a greater width, it can be usefully applied to the case in which the organic light-emitting layer is formed on a high-resolution organic light-emitting display device as compared with the case in which the red subpixel R is used as the dispensing region.

In the present disclosure, since an organic light-emitting material is coated using a coating method, not a thermal deposition method, to form an organic light-emitting layer, processes can be performed quickly, fabricating costs can be reduced, and an organic light-emitting display device having a large area can be fabricated.

Further, in the present disclosure, even when the resolution of the organic light-emitting display device is doubled, a dispensing device that is generally used can be used by forming a dispensing region in a dummy pixel region, which has a width twice a width of a subpixel or greater, and dispensing an organic light-emitting material in the dispensing region to form an organic light-emitting layer. Accordingly, there is no need to fabricate a dispensing device for a high-resolution, and thus the fabricating costs of the organic light-emitting display device can be reduced, and the organic light-emitting display device can be fabricated quickly. In addition, when the organic light-emitting material is dispensed using the general dispensing device, dispensing tolerance can be minimized due to the widened dispensing region.

As described above, in the present disclosure, a dummy pixel region including a plurality of dummy subpixels is disposed, and at least one dummy subpixel forms a first dispensing region onto which an organic light-emitting material is dispensed. Preferably, the first dispensing region can be formed to have a width larger than that of the red-, green-, or blue-subpixels. Here, the dummy pixel region can be used for expanding the area of the region in which the organic light-emitting material is dispensed, and thus a dispensing device that is generally used can be used to form an organic light-emitting layer.

Although many items are specifically described in the above description, this should be construed as an illustration of the exemplary embodiment rather than limiting the scope of the disclosure. Accordingly, the disclosure is not to be defined by the described embodiments but by the claims and their equivalents.

What is claimed is:

1. An organic light-emitting display device comprising:
a substrate including a pixel region including a plurality of red-subpixels, a plurality of green-subpixels, and a plurality of blue-subpixels, and a dummy pixel region including a plurality of dummy subpixels;
a plurality of first bank layers disposed in the pixel region in a first direction and a second direction to define a plurality of subpixels;
a plurality of second bank layers disposed on the first bank layers in the first direction in the pixel region to partition boundaries between a red-subpixel column, a green-subpixel column, and a blue-subpixel column; and
an organic light-emitting element disposed on each of the subpixels;
wherein at least one dummy subpixel forms a first dispensing region onto which an organic light-emitting material is dispensed.

2. The organic light-emitting display device of claim 1, wherein the first dispensing region has a width larger than a width of the red-subpixel, the green-subpixel, or the blue-subpixel.

3. The organic light-emitting display device of claim 2, further comprising a first dummy bank layer disposed between the dummy subpixels in the dummy pixel region.

4. The organic light-emitting display device of claim 3, wherein the first bank layers and the first dummy bank layer are made of a hydrophilic material, and the second bank layers are made of a hydrophobic material.

5. The organic light-emitting display device of claim 1, wherein one of the second bank layers has a width less than a width of one of the first bank layers so that a portion of the first bank layer is exposed to have an organic light-emitting layer disposed thereon.

6. The organic light-emitting display device of claim 1, wherein one of the second bank layers has a width that is the same as a width of one of the first bank layers.

7. The organic light-emitting display device of claim 1, wherein the first dispensing region includes a red-dispensing region, a green-dispensing region, or a blue-dispensing region onto which a red-organic light-emitting material, a green-organic light-emitting material, or a blue-organic light-emitting material is dispensed, respectively.

8. The organic light-emitting display device of claim 7, wherein the first bank layers are disposed between the red-dispensing region, the green-dispensing region, and the blue-dispensing region, and between the red-subpixel column, the green-subpixel column, and the blue-subpixel column of the pixel region.

9. The organic light-emitting display device of claim 1, further comprising a second dummy bank layer disposed between the dummy subpixels of different color and having hydrophobic.

10. The organic light-emitting display device of claim 1, wherein the second bank layers are further disposed between the subpixels and the dummy subpixels of different colors.

11. The organic light-emitting display device of claim 1, wherein the first dispensing region includes at least two dummy subpixels.

12. The organic light-emitting display device of claim 11, further comprising a first dummy bank layer having hydrophilic and disposed between the at least two dummy subpixels in the first dispensing region.

13. The organic light-emitting display device of claim 1, wherein the first dispensing region includes one dummy subpixel.

14. The organic light-emitting display device of claim 13, wherein the one dummy subpixel has a width more than twice that of a width of the red-subpixel, the green-subpixel, or the blue-subpixel.

15. The organic light-emitting display device of claim 1, wherein the red-subpixel, the green-subpixel, and the blue-subpixel have different widths.

16. The organic light-emitting display device of claim 15, wherein the first dispensing region has the same width as a subpixel having a greatest width among the red-subpixels, the green-subpixels, and the blue-subpixels.

17. The organic light-emitting display device of claim 15, wherein a subpixel, which has the greatest width among the red-subpixels, the green-subpixels, and the blue-subpixels of the pixel region, is a second dispensing region onto which the organic light-emitting material is dispensed.

18. The organic light-emitting display device of claim 15, wherein a subpixel having the greatest width and a subpixel having a second greatest width among the red-subpixels, the green-subpixels, and the blue-subpixels of the pixel region are a second dispensing region and a third dispensing region, respectively, onto which the organic light-emitting materials are dispensed.

19. A method of fabricating an organic light-emitting display device, the method comprising: forming a plurality of first bank layers disposed in a pixel region of a substrate in a first direction and a second direction to define a plurality of red-subpixels, a plurality of green-subpixels, and a plurality of blue-subpixels, a plurality of second bank layers disposed on the first bank layers in the first direction to partition boundaries between a red-subpixel column, a green-subpixel column, and a blue-subpixel column, and a dummy pixel region including a plurality of dummy subpixels, at least one dummy subpixel forming a dispensing region onto which an organic light-emitting material is dispensed; forming a first electrode in the subpixels; coating the organic light-emitting material on each of the red-subpixel column, the green-subpixel column, or the blue-subpixel column by dispensing the organic light-emitting material onto the dispensing region; and drying the organic light-emitting material to form an organic light-emitting layer.

20. The method of claim 19, wherein the coating of the organic light-emitting material includes allowing the organic light-emitting material dispensed onto the dispensing region to spread into a subpixel column, which has a corresponding color among the red-subpixel column, the green-subpixel column, and the blue-subpixel column, of the pixel region through the first bank layer.

21. The method of claim 19, wherein the red-subpixels, the green-subpixels, and the blue-subpixels are formed to have different widths.

22. The method of claim 21, wherein the dispensing region is formed to have the same width as a subpixel having a greatest width among the red-subpixels, the green-subpixels, and the blue-subpixels.

23. The method of claim 22, wherein the coating of the organic light-emitting material further includes dispensing an organic light-emitting material that has a color corresponding to a subpixel having the greatest width among the red-subpixels, the green-subpixels, and the blue-subpixels of the pixel region.

24. The method of claim 22, wherein the coating of the organic light-emitting material further includes dispensing organic light-emitting materials that have colors corresponding to a subpixel having the greatest width and a subpixel having a second greatest width among the red-subpixels, the green-subpixels, and the blue-subpixels of the pixel region.

* * * * *